(12) United States Patent
Kitai

(10) Patent No.: US 7,647,570 B2
(45) Date of Patent: Jan. 12, 2010

(54) SYSTEM AND METHOD FOR CHECKING EQUIVALENCE BETWEEN DESCRIPTIONS

(75) Inventor: Tomoya Kitai, Tokyo (JP)

(73) Assignee: NEC Corporation, Tokyo (JP)

( * ) Notice: Subject to any disclaimer, the term of this patent is extended or adjusted under 35 U.S.C. 154(b) by 175 days.

(21) Appl. No.: 11/692,374

(22) Filed: Mar. 28, 2007

(65) Prior Publication Data

US 2007/0234244 A1    Oct. 4, 2007

(30) Foreign Application Priority Data

Mar. 29, 2006    (JP)    ............... 2006-091258

(51) Int. Cl.
*G06F 17/50*    (2006.01)
(52) U.S. Cl. ............................... 716/4; 716/5
(58) Field of Classification Search .................. 716/1–5, 716/18; 703/13–22
See application file for complete search history.

(56) References Cited

U.S. PATENT DOCUMENTS

2004/0025127 A1 *   2/2004   Takenaka ..................... 716/5
2005/0289486 A1 *  12/2005   Caron et al. ................... 716/3
2007/0028204 A1 *   2/2007   Takeda ......................... 716/18

FOREIGN PATENT DOCUMENTS

JP    2000-259696 A    9/2000
JP    2003-141202 A    5/2003

OTHER PUBLICATIONS

Takeshi Takenaka et al. "An equivalence checking between behavioral description and register transfer level description for behavioral synthesis." The 17th Karuizawa Workshop on Circuits and Systems, 2004, pp. 555-560.

* cited by examiner

*Primary Examiner*—Thuan Do
*Assistant Examiner*—Nghia M Doan
(74) *Attorney, Agent, or Firm*—Sughrue Mion, PLLC

(57) ABSTRACT

A behavior synthesis apparatus performs a behavior synthesis while optimizing an intermediate point pair, which is equivalent to each other only under a condition to be referenced. When an equivalence condition is provided for an intermediate cone, an equivalence-condition setting unit provides the intermediate cone with the condition for the equivalence. A logic-cone comparison unit determines whether or not the intermediate cone is equivalent under the provided equivalence condition. An intermediate-point-result reflection unit simplifies the intermediate cone with respect to the intermediate point pair determined to be equivalent in the logic cones to be verified. The logic-cone comparison unit checks the equivalence using the simplified logic cone.

30 Claims, 19 Drawing Sheets

FIG. 3

```
int mode_in;
int in0,in1;
int out0;

int ary[256];

void main()
{
  int mode;
  int adr,dat1;

mode = mode_in;
  adr=0;
  if(mode==0) {
    adr=in0;
  }
  if(mode==1) {
    adr=in1;
  }
  dat1 = ary[adr];

switch(mode) {
  case 0:
    out0=dat1;
    break;
  case 1:
    out0=dat1;
    break;
  case 2:
    out0=0;
    break;
  default:
    out0=0xff;
    break;
  }
   return;
}
```

FIG. 4

```verilog
module main (mode_in, in0, in1, out0)
input    [0:1]    mode_in ;
input    [0:7]    in0 ;
input    [0:7]    in1 ;
output   [0:7]    out0 ;
wire     [0:7]    ary_ad ;
wire     [0:7]    ary_rd ;
wire     [0:1]    mode ;
reg      [0:1]    out0 ;
reg      [0:7]    adr ;

assign   mode = mode_in ;
assign   ary_ad = adr ;

always @ (ary_rd or mode)
        case (mode)
        2'h0:
                out0 = ary_rd ;
        2'h1:
                out0 = ary_rd ;
        2'h2:
                out0 = 8'h0 ;
        default:
                out0 = 8'hff ;
        endcase always @ (in1 or in0 or mode)
        case (mode)
        2'h0:
                adr = in0 ;
        default:
                adr = in1 ;
        endcase memo08 ARY_0 (mem08_wd(ary_wd), mem08_wd(ary_adr),
              .mem08_we(ary_we), mem08_rd(ary_rd));

endmodule
```

(a)  (b)

(a)  (b)

SYSTEM AND METHOD FOR CHECKING EQUIVALENCE BETWEEN DESCRIPTIONS

FIELD OF THE INVENTION

The present invention relates to a system and a method for checking equivalence between descriptions. More specifically, the present invention relates to a system and a method for checking equivalence between two descriptions such as between behavior description and RTL description. The present invention also relates to a behavior synthesis apparatus using the system, as well as the method and program used in the apparatus.

DESCRIPTION OF THE RELATED ART

A recent LSI design often synthesizes a RTL (register-transfer level) description capable of logic synthesis from a highly abstract behavior description by using a behavior synthesis system. This design technique can decrease the amount of description by providing the design at a highly abstract behavior level and can greatly improve the productivity of design and verification. The behavior description uses an extended C language and the other languages such as System C and Spec C languages.

Generally, a behavior synthesis system is constructed by software. Even with utmost care, the software makes it difficult to eliminate a possibility that the system itself contains a bug. As the scope of behavior synthesis expands, there may be a case where the behavior description is applied to all the verification and maintenance operations. When a bug in the behavior synthesis system generates an incorrect RTL description, the verification on the behavior description will be meaningless, and a subsequent process may also necessitate a rework. The rework in the subsequent process may extend a development period, increase the number of steps, and result in a great loss. For this reason, when the behavior synthesis system is applied to an actual LSI design, it is important to ensure correctness of the synthesized RTL description, i.e., to verify equivalence between the behavior description and the resultant RTL description.

A simulation using a specified test pattern can provide an equivalence checking process between the behavior description and the RTL description. However, the simulation using a test pattern requires a longer time length and higher costs for generating the test pattern. In addition, verification coverage depends on the test patterns. Thus, a complete verification is difficult to achieve. Some equivalence checking techniques are performed based on the formal technique in a behavior synthesis system. The formal-technique-based equivalence checking between the behavior description and the RTL description can ensure the equivalence between the behavior description input to the behavior synthesis system and the RTL description output from the behavior synthesis system without using the test patterns. This technique is effective for ensuring correctness of a synthesized circuit.

An example of the system for checking equivalence between the behavior description and the RTL description based on the conventional formal technique is described in a literature, presented by Takashi Takenaka and five others, "An equivalence checking between behavior description and register transfer level description for behavior synthesis," in the 17th Karuizawa Workshop on Circuits and Systems, 2004, pp. 555-560. FIG. 15 shows the configuration of the equivalence checking system described in the above literature. The conventional equivalence checking system 200 includes: a behavior-description storage unit 201, a behavior synthesis apparatus 202, a RTL-description storage unit 203, a model construction unit 204, a model storage unit 205, a logic-one extraction unit 206, a logic-cone storage unit 207, a correspondence storage unit 208 for storing correspondence between the behavior description and the RTL description, and a logic-cone comparison unit 209.

FIG. 16 shows an operational procedure of the equivalence checking system described in the above literature. The behavior synthesis apparatus 202 reads a behavior description from the behavior-description storage unit 201 and performs behavior synthesis (Step S21). The behavior synthesis apparatus 202 stores the RTL description resulting from the behavior synthesis in the RTL-description storage unit 203. The model construction unit 204 reads the behavior description stored in the behavior-description storage unit 201 and the RTL description stored in the RTL-description storage unit 203. The model construction unit 204 constructs verification models for the behavior description and the RTL description (Step S22). Some verification models are based on an extended finite state machine capable of expressing a control structure and signal value (digital code) changes, for example.

The behavior synthesis apparatus 202 stores the correspondence generated during the behavior synthesis in the correspondence storage unit 208 (Step S23). The correspondence includes information about conversion from the behavior description into the RTL description as well as information indicated by the correspondence between a variable in the behavior description and a register in the RTL description. The logic-one extraction unit 206 reads the model constructed at Step S22 from the model storage unit 205. The logic-cone extraction unit 206 performs term rewriting or symbolic simulation to extract a logic cone from the two models stored at Step S23 in the correspondence storage unit 208. The logic cone concerns a signal value for the corresponding signal line to be verified. The logic-one extraction unit 206 stores the extracted logic cone in the logic-cone storage unit 207 (Step S24). The logic cone is an equation that represents a signal change in an execution sequence.

The logic-cone comparison unit 209 reads the logic cone extracted at Step S24 from the logic-one storage unit 207. The logic-cone comparison unit 209 compares the logic cones for two descriptions about the signal line to be verified or object signal line (Step S25). When the comparison result shows a match between the logic cones for the two descriptions about all signal lines to be verified with respect to all execution sequences, the logic-cone comparison unit 209 determines that the behavior description is equivalent to the RTL description.

Patent Publication JP-2003-141202A describes a high-speed equivalence checking system for accelerating equivalence checking processing between the behavior description and the RTL description based on the conventional formal technique. In this patent publication, the behavior synthesis apparatus specifies an intermediate point pair considered to be equivalent to each other in those descriptions. A logic verification apparatus confirms the intermediate point pair to be actually equivalent to each other and simplifies a signal value function by using the intermediate terminal. Generally, the formal equivalence checking complicates the signal value functions and increases the time length needed for comparison. The above patent publication uses the correspondence between the intermediate points and divides the verification to obtain a high-speed verification.

FIG. 17 shows the configuration of the equivalence checking system described in the above patent publication. In addition to the configuration shown in FIG. 15, the equivalence checking system 300 includes an intermediate-cone extraction unit 309, an intermediate-cone storage unit 310, an intermediate-point-result reflection unit 311, an intermediate-point-simplified-cone storage unit 312, and an intermediate-point-result storage unit 314. A behavior-description storage unit 301 through a correspondence storage unit 308 correspond to the behavior-description storage unit 201 through the correspondence storage unit 208, respectively, in FIG. 15. A logic-one comparison unit 313 corresponds to the logic-cone comparison unit 209 in FIG. 15. The intermediate-cone extraction unit 309 references the correspondence storage unit 308. The intermediate-cone extraction unit 309 extracts an intermediate cone in the descriptions for the intermediate point pair considered to be equivalent, based on the correspondence output from the behavior synthesis apparatus 302 and stores the extracted intermediate cone in the intermediate-cone storage unit 310.

According to the patent publication, the logic-cone comparison unit 313 checks the equivalence of not only a logic cone for a signal line to be verified, but also an intermediate cone. The logic-cone comparison unit 313 checks the equivalence of an intermediate cone. When the intermediate cone is equivalent, the logic-cone comparison unit 313 stores a result of equivalence in the intermediate-point-result storage unit 314. When there is an intermediate point showing the equivalence, which is indicated by the result stored in intermediate-point result storage unit 314, the intermediate-point-result reflection unit 311 uses the intermediate point as an intermediate terminal to simplify the logic cone with respect to a signal value for the signal line to be verified. The intermediate-point-result reflection unit 311 then stores the simplified logic cone in the intermediate-point-simplified-cone storage unit 312. When the intermediate-point-simplified-cone storage unit 312 stores therein logic cones as simplified intermediate cones, the logic-cone comparison unit 313 compares the simplified logic cones with each other and checks equivalence between the behavior description and the RTL description.

FIG. 18 shows an operational procedure of the equivalence checking system described in the patent publication. Behavior synthesis, verification model construction, correspondence acquisition, and logic cone extraction are equivalent to those in Steps S21 through S24 in FIG. 16 (Steps S401 through S404). After the logic cone extraction, the intermediate-cone extraction unit 309 determines whether or not there is an intermediate point pair (referred to as simply intermediate point sometimes) having correspondence with respect to the signal value function (Step S405). If such an intermediate point exists in the descriptions, the intermediate-cone extraction unit 309 extracts an intermediate cone for the intermediate point (Step S406). When the intermediate cone is extracted, the logic-cone comparison unit 313 compares the intermediate cones with respect to the intermediate point (Step S407).

The logic-cone comparison unit 313 determines whether or not the intermediate point is equivalent (Step S408). If it is found that the intermediate point is equivalent, the logic-cone comparison unit 313 stores the result of equivalence in an equivalence-condition holding unit so as to simplify the logic cone by using the intermediate point as an intermediate terminal (Step S409). If it is found that the intermediate point is not equivalent, the intermediate point cannot be simplified and is not used in the succeeding processings. The logic-cone comparison unit 313 determines whether or not there is another corresponding intermediate point (Step S410). Where there is one, the logic-cone comparison unit 313 returns to Step S406 and repeats the above-described process for all the corresponding intermediate points.

If it is determined at Step S410 that there is no remaining corresponding intermediate point, the intermediate-point-result reflection unit 311 simplifies the logic cone with respect to the signal line to be verified by using the equivalent intermediate point as an intermediate terminal (Step S411). The intermediate-point-result reflection unit 311 does not simplify using an intermediate point not determined to be equivalent. Finally, the logic-cone comparison unit 313 compares logic cones with respect to the signal line to be verified (Step S412). When logic cones are simplified by using the equivalent intermediate point, the logic-cone comparison unit 313 compares the simplified logic cones stored in the intermediate-point-simplified-cone storage unit 312.

Enhancement of the design scale prolongs the verification time accordingly. Thus, there is an increasing demand to further accelerate the equivalence checking between descriptions before and after the synthesis by using an equivalence checking system. On the other hand, it is necessary to fast operate the circuit to be designed and reduce the occupied area thereof. For this purpose, an optimization may be provided so that part of the circuit becomes equivalent only under the condition that part is referenced, without affecting the output value from an output signal line.

FIG. 19($a$) exemplifies part of the circuit to be designed. FIG. 19($b$) shows a circuit part equivalent to the part of circuit of FIG. 19($a$). In FIG. 19($a$), a multiplexer mux1 provides an input to an adder ADD. Multiplexer mux1 outputs x under condition c1 being satisfied, outputs y under condition c2 being satisfied, and outputs z otherwise. An analysis on the circuit behavior shows that multiplexer mux2 is connected to an output of adder ADD. Output from adder ADD is referenced only when condition c1 or c2 is satisfied. Thus, it is understood that the behavior of multiplexer mux1 for outputting z does not affect "out", i.e., an output from multiplexer mux2.

As shown in FIG. 19B, multiplexer mux1 is modified so as to output x under condition c1 being satisfied and output y otherwise. The value of "out" in FIG. 19B is equivalent to that before the modification shown in FIG. 19A. In this manner, a focus is provided on part of the circuit and a condition to be referenced. The focused part is optimized so as to be equivalent only under the referenced condition so long as an output from the entire circuit is not affected. This makes it possible to generate a faster circuit having a smaller occupied area.

The optimization is not only provided manually, but also positively applied to recent behavior synthesis systems so as to provide higher-quality synthesis results. However, the optimization may hinder the equivalence checking between behavior description and RTL description when a logic cone with respect to a signal value is simplified at an intermediate point capable of being determined to be equivalent for the purpose of acceleration of verification. This will be described below.

According to the technique described in the patent publication described before, the behavior synthesis apparatus specifies a pair of intermediate points considered to be equivalent to each other. The logic verification apparatus confirms the intermediate points to be actually equivalent to each other and simplifies the logic cones with respect to a signal value using the intermediate point as an intermediate terminal. In this case, for example, an attempt is made to check the equivalence of "out" by assuming the structure of FIG. 19A to be a logic cone extracted from the behavior description and the structure of FIG. 19B to be a logic cone extracted from the RTL description. Even when the output from multiplexer mux1 is selected as a corresponding intermediate point, it is not an equivalent intermediate point. Thus, the circuit part cannot be simplified with respect to the output. Although the intermediate point is optimized by the technique as described above, the intermediate point itself is not equivalent and cannot be treated as an intermediate terminal. As a result, fast verification is difficult.

To solve the above problem, Patent Publication JP-2000-259696A describes a similar technology at a first glance. This patent publication describes the technology for avoiding the problem that results from simplifying and verifying part of a circuit by using an intermediate terminal. When simplifying the part of the circuit by using the intermediate terminal, the technology finds a condition for possible values that can be assigned to two or more intermediate terminals. In consideration for the condition, the technology checks the equivalence of a signal value (digital code) for a signal line to be verified. The technology disclosed in JP-2000-259696A will be described with reference to FIG. 20. A logic cone shown in (a) of FIG. 20 contains two intermediate signal lines mout0 and mout1 corresponding to a signal line "out" to be verified. From a design viewpoint, the intermediate signal lines are not simultaneously set at "1" with reference to the circuit connection situation. In this case, as shown in (b) of FIG. 20, let us assume intermediate signal lines mout0 and mout1 to be intermediate terminals and simply verify the signal line "out" which is the subject to be verified. The verification is performed for an impossible combination of mout0 and mout1 and therefore fails. JP-2000-259696A provides such intermediate terminals with a conditional equation (mout0 xor mout1==1). Signal values for the signal line "out" to be verified are compared in consideration for this condition. That is, signal values are compared with respect to two sets of mout0 and mout1 values (0, 1) and (1, 0).

As described above, JP-2000-259696A performs the verification by placing restrictions on values assignable to two or more intermediate terminals. The verification is performed for only a set of values actually assignable to intermediate terminals, thus preventing an incorrect verification result. However, JP-2000-259696A simply places restrictions on values assignable to intermediate points and avoids verification specific values with respect to two or more intermediate terminals. That is, when there is no restriction on multiple intermediate terminals, the formal verification considers a set of values actually unavailable for intermediate point behaviors during comparison of logic cones for a signal line to be verified and may output an incorrect verification result.

In order to prevent such incorrect verification from occurring, the technology described in JP-2000-259696A places restrictions on values assignable to intermediate points and avoids verification of a specific set of values with respect to two or more intermediate terminals. However, such condition is not generally available for the problem discussed in the present invention, i.e., an intermediate point that is optimized and becomes nonequivalent. Even though the condition can be taken into consideration, it is not possible to determine a nonequivalent intermediate point to be equivalent and treat it as an intermediate terminal.

SUMMARY OF THE INVENTION

It is an object of the present invention to provide an equivalence checking system, method, and program capable of solving the problem of conventional technologies and checking equivalence between two descriptions to treat an optimized nonequivalent intermediate point as an intermediate terminal.

It is another object of the present invention to provide a behavior synthesis apparatus, method, and program used for the equivalence checking system, method, and program.

The present invention provides an equivalence checking apparatus for checking equivalence between a first description and a second description, including: an intermediate cone extracting unit for extracting, from the first and second descriptions, an intermediate cone pair corresponding to each other and defined from an objective signal line common to the first and second descriptions: a logic-cone comparison unit for comparing the extracted intermediate cone pair while referencing an equivalence condition defining a condition for referencing stored corresponding to the intermediate cone pair in an equivalence-condition storage unit, the logic-cone comparison unit judging whether or not the intermediate cone pair is equivalent to each other under the equivalence condition; and an intermediate-point-result reflection unit for simplifying the logic cone pair with respect to the intermediate cone pair if the logic-cone comparison unit judges an equivalence.

The present invention also provides a method for checking equivalence between a first description and a second description in a computer, including the steps of: extracting, from the first and second descriptions, an intermediate cone pair corresponding to each other and defined from an objective signal line common to the first and second descriptions: comparing the extracted intermediate cone pair while referencing an equivalence condition defining a condition for referencing stored corresponding to the intermediate cone pair in an equivalence-condition storage unit to judge whether or not the intermediate cone pair is equivalent to each other under the equivalence condition; simplifying the logic cone pair with respect to the intermediate cone pair if the logic-cone comparing step judges an equivalence; and judging an equivalence between the first description and the second description based on the simplified logic cone.

The present invention provides a program running on a compute for checking equivalence between a first description and a second description, to operate the computer in the steps of: extracting, from the first and second descriptions, an intermediate cone pair corresponding to each other and defined from an objective signal line common to the first and second descriptions: comparing the extracted intermediate cone pair while referencing an equivalence condition defining a condition for referencing stored corresponding to the intermediate cone pair in an equivalence-condition storage unit, to judge whether or not the intermediate cone pair is equivalent to each other under the equivalence condition; simplifying the logic cone pair with respect to the intermediate cone pair if the logic-cone comparing step judges an equivalence; and judging an equivalence between the first description and the second description based on the simplified logic cone.

The present invention provides a behavior synthesis apparatus for logically synthesizing a behavior description to generate a RTL description, including: an equivalence-condition storage unit for storing therein an equivalence condition under which an intermediate point pair in the descriptions are equivalent to each other without affecting an output from an output signal line; and a behavior-synthesis unit for reading a behavior description from a behavior-description storage unit, to logically synthesize the behavior description to generate the RTL description after simplifying the logic cone pair based on the equivalence condition.

The present invention provides a behavior synthesis method for logically synthesizing a behavior description to generate a RTL description in a computer, including the steps of: storing in a storage unit an equivalence condition under which an intermediate point pair in the descriptions are equivalent to each other without affecting an output from an output signal line, and reading a behavior description from a behavior-description storage unit, to logically synthesize the behavior description to generate the RTL description after simplifying the logic cone pair based on the equivalence condition.

The present invention provides a program running on a compute for logically synthesizing a behavior description to generate a RTL description to operate the computer in the steps of: storing in a storage unit an equivalence condition under which an intermediate point pair in the descriptions are equivalent to each other without affecting an output from an output signal line; and reading a behavior description from a behavior-description storage unit to logically synthesize the behavior description to generate the RTL description after simplifying the logic cone pair based on the equivalence condition.

The above and other objects, features and advantages of the present invention will be more apparent from the following description, referring to the accompanying drawings.

BRIEF DESCRIPTION OF THE DRAWINGS

FIG. 3 shows an example of behavior description stored in a behavior-description storage unit;

FIG. 4 shows an example of RTL description resulting from behavior synthesis of the behavior description in FIG. 3;

DETAILED DESCRIPTION OF THE PREFERRED EMBODIMENTS

Figure 1:
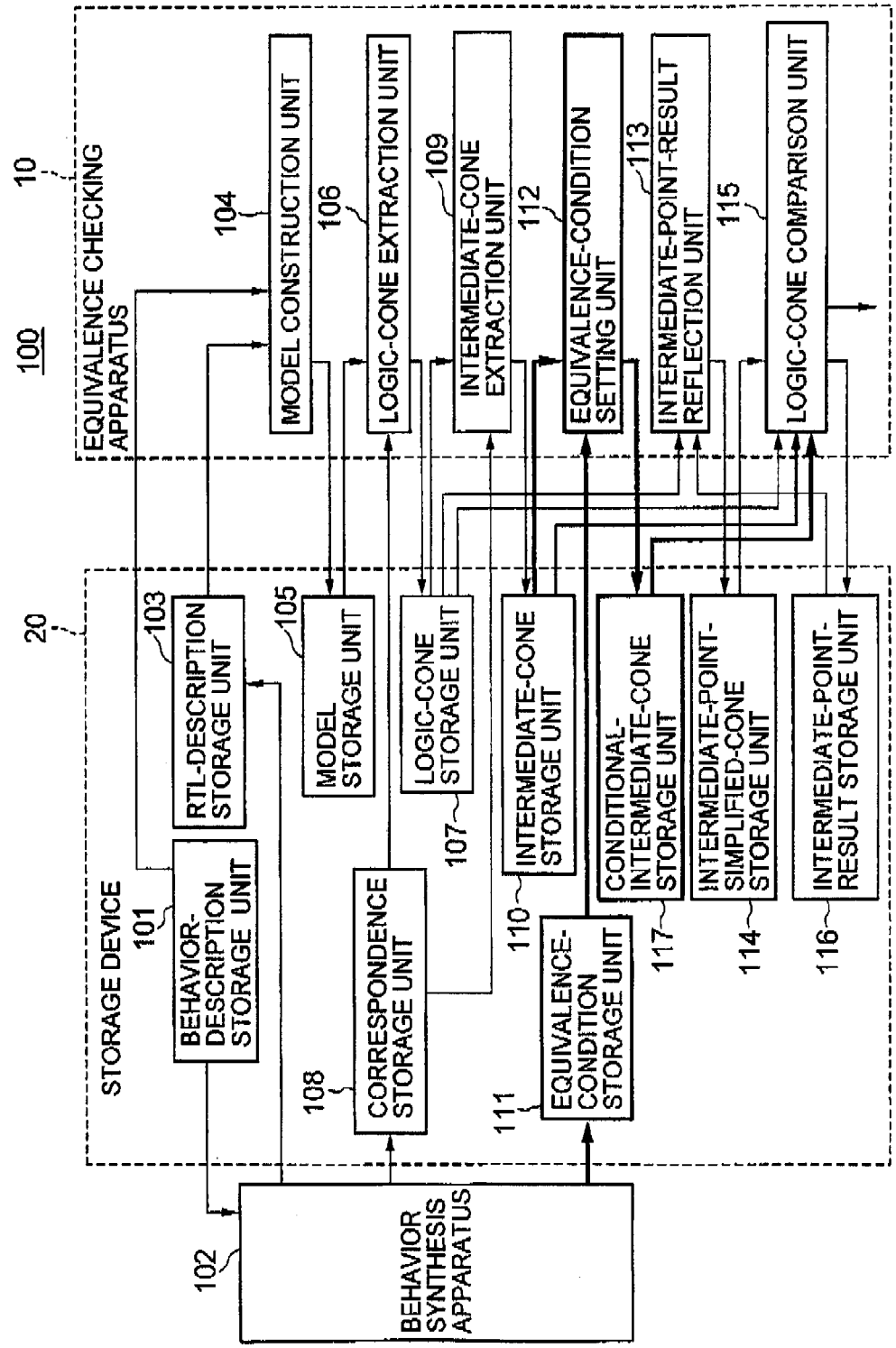
FIG. 1 is a block diagram showing the configuration of an equivalence checking system according to a first embodiment of the invention.

Embodiments of the present invention will be described in further detail with reference to the accompanying drawings, wherein similar constituent elements are designated by similar reference numerals. FIG. 1 shows the configuration of an equivalence checking system according to a first embodiment of the invention. The equivalence checking system 100 includes an equivalence checking apparatus 10, a storage apparatus 20, and a behavior synthesis apparatus 102. The equivalence checking apparatus 10 includes a model construction unit 104, a logic-cone extraction unit 106, an intermediate-cone extraction unit 109, an equivalence-condition setting unit 112, an intermediate-point-result reflection unit 113, and a logic-cone comparison unit 115.

The storage apparatus 20 includes a behavior-description storage unit 101, a RTL-description storage unit 103, a model storage unit 105, a logic-cone storage unit 107, a correspondence storage unit 108, an intermediate-cone storage unit 110, an equivalence-condition storage unit 111, an intermediate-point-simplified-cone storage unit 114, an intermediate-point-result storage unit 116, and a conditional-intermediate-cone storage unit 117.

The behavior-description storage unit 101 stores therein a behavior-level description created by a designer. The behavior-level description uses an extended C language and the other languages such as System C and Spec C languages. The behavior synthesis apparatus 102 performs behavior synthesis on the behavior-level description and outputs a RTL description obtained from the behavior-level description. The RTL, description can use such languages as Verilog-HDL and VHDL. The RTL-description storage unit 103 stores therein the RTL description output from the behavior synthesis apparatus 102. During the behavior synthesis, the behavior synthesis apparatus 102 generates a correspondence and an equivalence condition between the behavior-level description as input and the RTL description as output. The correspondence storage unit 108 and the equivalence-condition storage unit 111 respectively store therein a correspondence and an equivalence condition output from the behavior synthesis apparatus 102.

The correspondence indicates a correspondence between descriptions before and after the synthesis in the behavior synthesis process and contains information including which fragment in the behavior description is converted into which fragment in the RTL description, and which variable is converted into which register. The correspondence also contains information including an intermediate terminal (intermediate point) assumed to be equivalent. The equivalence-condition storage unit 111 stores therein an equivalence condition for an intermediate terminal to be equivalent. The behavior synthesis process focuses on that condition for referencing part of the circuit. So long as the output from the entire circuit is not affected, it is optimized to be equivalent at least when the focused part is referenced.

The model construction unit 104 constructs a verification model used inside the equivalence checking apparatus 10 based on the behavior-level description and the RTL description. Examples of the model to be constructed include a model capable of expressing the control structure and the signal value structure based on a finite state machine. The model storage unit 105 stores therein a model constructed by the model construction unit 104. The logic-cone extraction unit 106 is supplied with models that are stored in the model storage unit 105 and are constructed for the behavior-level description and the RTL description. The logic-cone extraction unit 106 is also supplied with a correspondence stored in the correspondence storage unit 108. From each model, the logic-cone extraction unit 106 extracts a logic cone with respect to a signal value of a corresponding signal line to be verified. The logic-cone storage unit 107 stores therein the logic cone extracted by the logic-cone extraction unit 106.

The intermediate-cone extraction unit 109 is supplied with a logic cone stored in the logic-cone storage unit 107 and a correspondence stored in the correspondence storage unit 108. The intermediate-cone extraction unit 109 extracts, from the logic cone, an intermediate cone with respect to a signal value at an intermediate point (signal line) based on information about an intermediate point assumed to be equivalent in the correspondence. The intermediate cone is extracted when the logic cone contains intermediate points having the correspondence. Alternatively, the intermediate-cone extraction unit 109 itself may extract an intermediate point assumed to be equivalent. The intermediate-cone storage unit 110 stores therein the intermediate cone extracted by the intermediate-cone extraction unit 109.

The equivalence-condition setting unit 112 is supplied with an intermediate cone stored in the intermediate-cone storage unit 110 and an equivalence condition stored in the equivalence-condition storage unit 111. When an intermediate cone becomes equivalent only under the equivalence condition, the equivalence-condition setting unit 112 assigns that equivalence condition to the intermediate cone as a precondition for the intermediate cone to be equivalent. The conditional-intermediate-cone storage unit 117 stores therein the intermediate cone provided with the equivalence condition by the equivalence-condition setting unit 112.

The logic-cone comparison unit 115 compares two cones having the correspondence between the behavior-level description and the RTL description and checks whether or not they are equivalent to each other. Cones to be compared include a logic cone with respect to the signal line to be verified, an intermediate cone with respect to the intermediate point, an intermediate cone provided with the equivalence condition, and a logic cone or an intermediate cone simplified for the intermediate point. When an equivalence condition is provided for comparison between intermediate cones with respect to the intermediate point, the logic-one comparison unit 115 uses the equivalence condition as a precondition and compares the intermediate cones to determine whether or not they are equivalent. That is, the logic-cone comparison unit 115 checks whether or not the following equation becomes true:

$$cnd \rightarrow (((sig1 == sig1')\hat{}(sig2 == sig2')\hat{}\ldots\hat{}(sign == sign')) \rightarrow (m(sig1, sig2, \ldots, sign) == m'(sig1', sig2', \ldots, sign'))),$$

where cnd is the equivalence condition, m(sig1,sig2,...,sign) is the signal value function represented by the intermediate cone for the behavior description, and m'(sig1',sig2' ... sign') is the signal value function represented by the intermediate cone for the RTL description.

If no equivalence condition is given with respect to the intermediate point, the logic-cone comparison unit 115 takes no conditions into account and compares intermediate cones to determine whether or not they match between the behavior description and the RTL description. When the comparison is made between intermediate cones having the correspondence with respect to the intermediate point and an equivalence is confirmed, it may be preferable to simplify intermediate cones with respect to the intermediate point and then compare them.

The logic-cone comparison unit 115 outputs a comparison result when the comparison is made between logic cones with respect to the signal line to be verified or between cones simplified with respect to the intermediate point. When intermediate cones are compared and a match is confirmed, the intermediate-point-result storage unit 116 stores therein the comparison result. When the comparison is made between intermediate cones provided with the equivalence condition, the intermediate-point-result storage unit 116 also stores therein the equivalence condition.

An intermediate cone match may be confirmed between the behavior description and the RTL description based on the comparison result stored in the intermediate-point-result storage unit 116 with respect to the intermediate cone. In this case, the intermediate-point-result reflection unit 113 reads a logic cone containing the intermediate point from the logic-cone storage unit 107 and simplifies the logic cone. When a comparison result shows a match between intermediate points provided with no equivalence condition, the intermediate-point-result reflection unit 113 simplifies the logic cone with respect to the intermediate point using the intermediate point as an intermediate terminal.

The intermediate point provided with the equivalence point provided with the equivalence condition is replaced by a common cone. When the equivalence condition is true, the common cone outputs the same value for the behavior description and the RTL description. When the equivalence condition is not true, the common cone outputs different values. Alternatively, it may be preferable to simplify the logic cone by using different intermediate terminals for the behavior description and the RTL description with respect to the intermediate point and provide the logic cone with a precondition that two intermediate terminals become equal under the equivalence condition.

When verifying a signal line to be verified containing an intermediate point provided with the equivalence condition, it may be preferable to determine whether or not the following determination equation becomes true:

$$(cnd \rightarrow (x == x')) \rightarrow (((sig1 == sig1')\hat{}(sig2 == sig2')\hat{}\ldots\hat{}(sign == sign')) \rightarrow (f(sig1, sig2, \ldots, sign, x) == f'(sig1', sig2', \ldots, sign', x'))),$$

where cnd is the equivalence condition for the intermediate signal line, x is the intermediate terminal for the behavior description, x' is the intermediate terminal for the RTL description, and f(sig1,sig2,...,sign,x) and f(sig1',sig2',... sign',x') is the signal value functions represented by the logic cones using intermediate terminals for the behavior description and the RTL description, respectively. It should be noted that the equivalence condition generally places no restriction on values assignable to intermediate points. The intermediate-point-simplified-cone storage unit 114 stores therein the logic cone simplified by the intermediate-point-result reflection unit 113.

Figure 2:
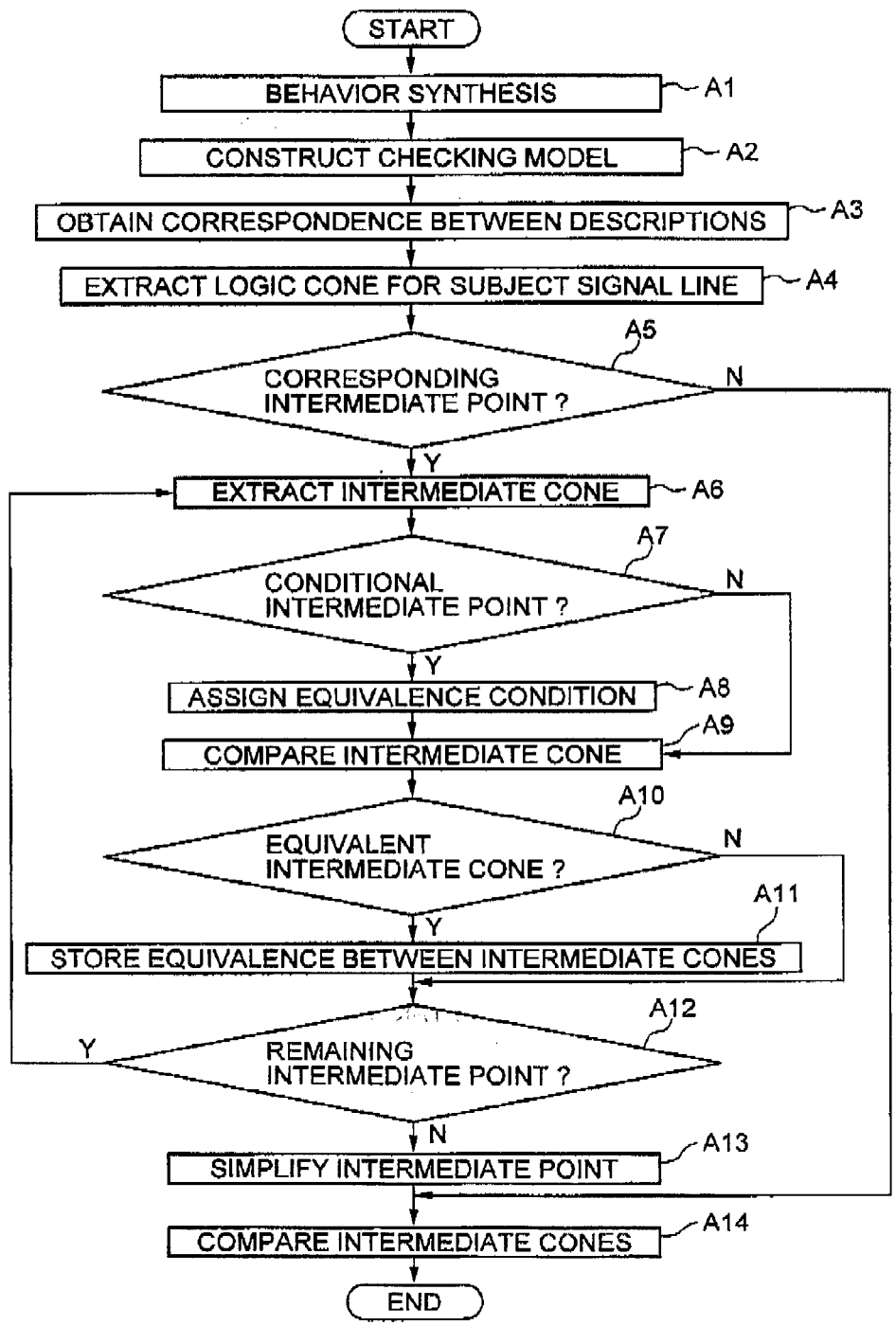
FIG. 2 is a flowchart showing an operational procedure of the equivalence checking system according to the first embodiment.

FIG. 2 shows an operational procedure of the equivalence checking system. A user creates a behavior description and stores the same in the behavior-description storage unit 101. The behavior synthesis apparatus 102 reads the behavior description from the behavior-description storage unit 101 and performs a behavior synthesis. The RTL-description storage unit 103 stores therein the RTL description resulting from the behavior synthesis (Step A1). When the behavior synthesis terminates, the equivalence checking apparatus 10 starts.

The model construction unit 104 reads the behavior description stored in the behavior-description storage unit 101 and the RTL description stored in the RTL-description storage unit 103. The model construction unit 104 constructs a verification model for the respective descriptions (Step A2). The model construction unit 104 stores the constructed verification model in the model storage unit 105.

The behavior synthesis apparatus 102 stores the correspondence between the behavior description and the RTL description resulting from the behavior synthesis and the condition for the intermediate signal line to be equivalent, in the correspondence storage unit 108 and the equivalence-condition storage unit 111, respectively. The logic-cone extraction unit 106 reads the correspondence from the correspondence storage unit 108 (Step A3). The logic-cone extraction unit 106 reads the verification model constructed at Step A2 from the model storage unit 105. Based on the correspondence, the logic-cone extraction unit 106 extracts a logic cone with respect to the signal value for the signal line to be verified (Step A4). The logic-cone extraction unit 106 stores therein the extracted logic cone in the logic-cone storage unit 107.

The intermediate-cone extraction unit 109 references the logic cone stored in the logic-cone storage unit 107 and the correspondence stored in the correspondence storage unit 108, and thereby determines whether or not there is a correspondence of the logic cone to the intermediate signal line. When there is a correspondence of the logic cone to the intermediate signal line, the intermediate-cone extraction unit 109 extracts an intermediate cone with respect to the intermediate signal line based on the correspondence (Step A6). The intermediate-cone extraction unit 109 stores the extracted intermediate cone in the intermediate-cone storage unit 110.

The equivalence-condition setting unit 112 references the equivalence-condition storage unit 111 and checks whether or not there is an equivalence condition for the intermediate cone extracted at Step A6 (Step A7). When there is an equivalence condition, the equivalence-condition setting unit 112 assigns the equivalence condition to the intermediate cone (Step A8) and stores the equivalence condition in the conditional-intermediate-cone storage unit 117.

The logic-cone comparison unit 115 references the intermediate-cone storage unit 110 or the conditional-intermediate-cone storage unit 117 and compares intermediate cones having the correspondence between the behavior description and the RTL description (Step A9). When the equivalence-condition setting unit 112 settles the equivalence condition at Step A7, the logic-cone comparison unit 115 performs the comparison by reading the equivalence condition from the conditional-intermediate-cone storage unit 117, providing the read equivalence condition as a precondition, and verifying the equivalence of the intermediate cone. When no equivalence condition is settled, the logic-cone comparison unit 115 takes no conditions into account and checks the equivalence of the intermediate cone. When intermediate cones are compared with respect to the intermediate point, it may be preferable to simplify the intermediate cones based on the comparison result and then perform the comparison.

The logic-cone comparison unit 115 determines whether or not the intermediate point is equivalent as a result of the equivalence checking for the intermediate cone (Step A10). When the intermediate point is equivalent, the logic-cone comparison unit 115 stores the result in the intermediate-point-result storage unit 116 (Step A11). When the equivalent intermediate point corresponds to the intermediate cone provided with the equivalence condition at Step A7, the logic-cone comparison unit 115 also stores the equivalence condition at Step A11. When the intermediate point is determined to be nonequivalent, no process is performed because it is impossible to provide the simplification such as replacing the intermediate point with an intermediate terminal.

The intermediate-cone extraction unit 109 determines whether or not there is another correspondence with respect to the intermediate point (Step A12). When there is one, the intermediate-cone extraction unit 109 returns to Step A6 and extracts an intermediate cone. When the process is performed from Steps A6 to A11 for the correspondence with respect to all the intermediate points, the intermediate-point-result reflection unit 113 references the intermediate-point-result storage unit 116 and simplifies the logic cone with respect to the signal value of the signal line to be verified based on the result of the intermediate point comparison (Step A113).

The intermediate-point-result reflection unit 113 simplifies the intermediate cone with respect to the intermediate point provided with no equivalence condition by using the intermediate terminal. The intermediate-point-result reflection unit 113 simplifies the intermediate cone provided with the equivalence condition by replacing the intermediate cone with a common cone that becomes equivalent under a condition when satisfied. The intermediate-point-result reflection unit 113 stores the logic cone having the simplified intermediate point in the intermediate-point-simplified-cone storage unit 114.

Finally, the logic-cone comparison unit 115 compares logic cones for the signal line to be verified between the behavior description and the RTL description (Step A14). At Step A14, the logic-cone comparison unit 115 performs the comparison by referencing the logic cone stored in the logic-cone storage unit 107 when it is determined at Step A5 that there is no corresponding intermediate point or when the intermediate cone is not simplified for any intermediate points at Step A13. The logic-cone comparison unit 115 performs the comparison by referencing the logic cone stored in the intermediate-point-simplified-cone storage unit 114 when the intermediate point is somehow simplified at Step A13.

The above-described process will be described below using an example. FIG. 3 shows an example of behavior description stored in the behavior-description storage unit 101. In the behavior description, "mode_in", "in0", and "in1" represent input signal lines, and "out0" represents an output signal line. The behavior description places a value of "mode_in" "mode" and determines element "adr" of array "ary" to be referenced according to the value of "mode". The behavior description determines a value to be output to output signal line "out0" according to the value of "mode". The value to be output is the value of array "adr" or a constant value. The value of array "adr" is determined to be referenced in the preceding behavior.

The behavior synthesis apparatus 102 is supplied with the behavior description and performs the behavior synthesis process. FIG. 4 shows an example of the RTL description resulting from behavior synthesis of the behavior description in FIG. 3. Output signal line (variable) "out0" in the behavior description of FIG. 3 corresponds to equally named output signal line "out0" in the RTL description (FIG. 4) after the behavior synthesis. Intermediate signal line "adr" with respect to output signal line "out0" in the behavior description corresponds to equally named intermediate signal line "adr" in the RTL description.

In FIG. 3, "adr" specifies an element of array "ary" while "ary" is referenced only when "mode" is set at value 0 or 1. When "mode" is set at 0, "in0" is assigned to "adr". When "mode" is set at 1, "in1" is assigned to "adr". Assigning 0 to "adr" does not affect an output value of "out0". The RTL description after the behavior synthesis is optimized so as to eliminate the assignment of 0 to "adr" and assign "in1" to "adr" at any time when mode is not 0.

The behavior synthesis apparatus 102 outputs a correspondence between the behavior description and the RTL description with respect to an input/output signal line on an intermediate signal line. The behavior synthesis apparatus 102 also outputs a condition that allows the intermediate signal line having the correspondence to be equivalent. The RTL description resulting from the behavior synthesis is stored in the RTL-description storage unit 103. The correspondence and the equivalence condition resulting from the behavior synthesis are stored in the correspondence storage unit 108 and the equivalence-condition storage unit 111, respectively.

Specifically, the correspondence storage unit 108 stores the correspondence with respect to output signal line "out0" and intermediate signal line "adr". The RTL description (FIG. 4) is optimized under the condition that intermediate signal line "adr" is referenced when "mode" is set at value 0 or 1. Consequently, the equivalence-condition storage unit 111 stores therein this condition (mode==0)v(mode==1) as an equivalence condition with respect to intermediate signal line "adr".

Figure 5:
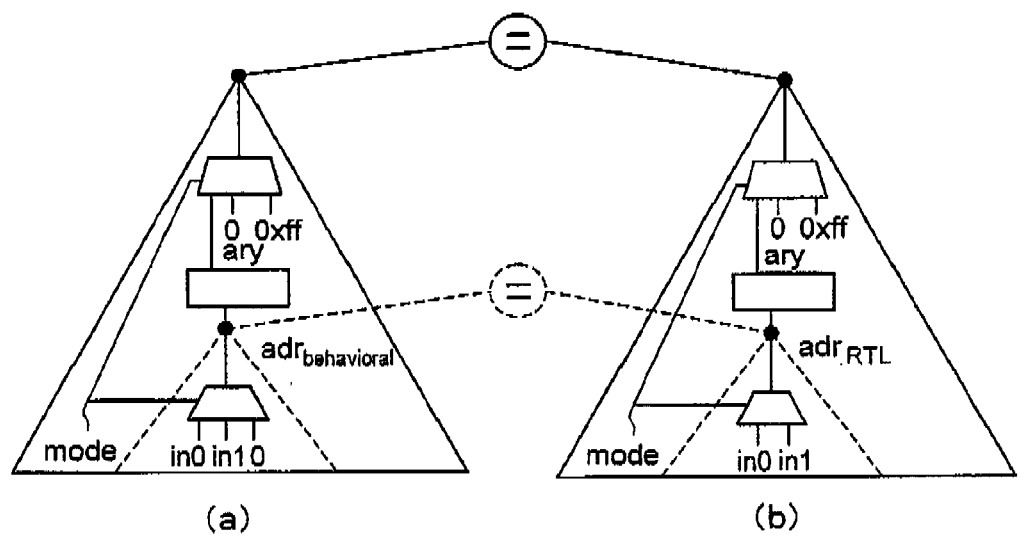
FIGS. 5(a) and (b) show logic cones for output signal line out0.

When the behavior synthesis apparatus 102 outputs the RTL description, the correspondences, and the equivalence condition, the equivalence checking apparatus 10 is activated to start verifying the equivalence between the behavior description and the RTL description. The model construction unit 104 constructs a verification model corresponding to each of the behavior description and the RTL description. The logic-cone extraction unit 106 then extracts a logic cone with respect to a signal to be verified from each of the constructed verification models before and after the behavior synthesis. The correspondence storage unit 108 stores therein information to the effect that output signal line "out0" has the correspondence between the behavior description and the RTL description. The logic-cone extraction unit 106 extracts a logic cone with respect to output signal line out0. FIG. 5 shows an example of extracted logic cones, wherein the left figure shows the logic cone corresponding to the behavior description (FIG. 3), and the right figure shows the logic cone corresponding to the RTL description (FIG. 4).

Figure 6:
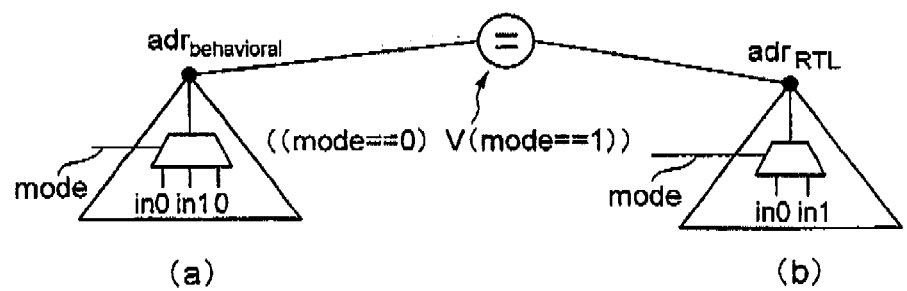
FIGS. 6(a) and (b) show intermediate cones extracted from the logic cones.

When it is determined at Step A5 (FIG. 2) whether or not there is a corresponding intermediate point, the correspondence storage unit 108 stores therein intermediate signal line "adr" assumed to have the correspondence between the behavior description and the RTL description. At Step A6, the intermediate-cone extraction unit 109 extracts a logic cone for intermediate signal line "adr" as an intermediate cone from each of the logic cone (shown in (a) of FIG. 5) corresponding to the behavior description and the logic cone (shown in (b) of FIG. 5) corresponding to the RTL description. The extracted intermediate cones are stored in the intermediate-cone storage unit 110. FIG. 6 shows the extracted intermediate cones. FIG. 6(a) shows the intermediate cone extracted from the logic cone corresponding to the behavior description, and FIG. 6(b) shows the intermediate cone extracted from the logic cone corresponding to the RTL description.

It is determined at Step A7 whether or not the intermediate point is provided with an equivalence condition. The correspondence storage unit 108 stores therein condition ((mode==0)v(mode==1)) for the intermediate point to become equivalent with respect to intermediate signal line "adr" that is determined to have the correspondence at Step A5. At Step A8, the equivalence-condition setting unit 112 stores the extracted intermediate cone and the equivalence condition in the conditional-intermediate-cone storage unit 117. At Step A9, the logic-cone comparison unit 115 checks the equivalence of intermediate signal line "adr" between the intermediate cone (shown on the left side of FIG. 6) corresponding to the behavior description and the intermediate cone (shown on the right side of FIG. 6) corresponding to the RTL description on the assumption that there is satisfied condition ((mode==0)V(mode==1)) provided by the equivalence-condition setting unit 112.

As described before, the optimization in the behavior synthesis does not always ensure an equivalent behavior between the intermediate cone corresponding to the behavior description and the intermediate cone corresponding to the RTL description with respect to intermediate signal line "adr". The intermediate cones, when compared simply, are not determined to be equivalent. However, the intermediate cones are determined to be equivalent when they are compared under a specified equivalence condition. When the intermediate cones are compared under the condition settled at Step A9, they are determined to be equivalent at Step A10. At Step A11, the intermediate-point-result storage unit 116 stores therein information to the effect that intermediate signal line "adr" is equivalent.

Figure 7:
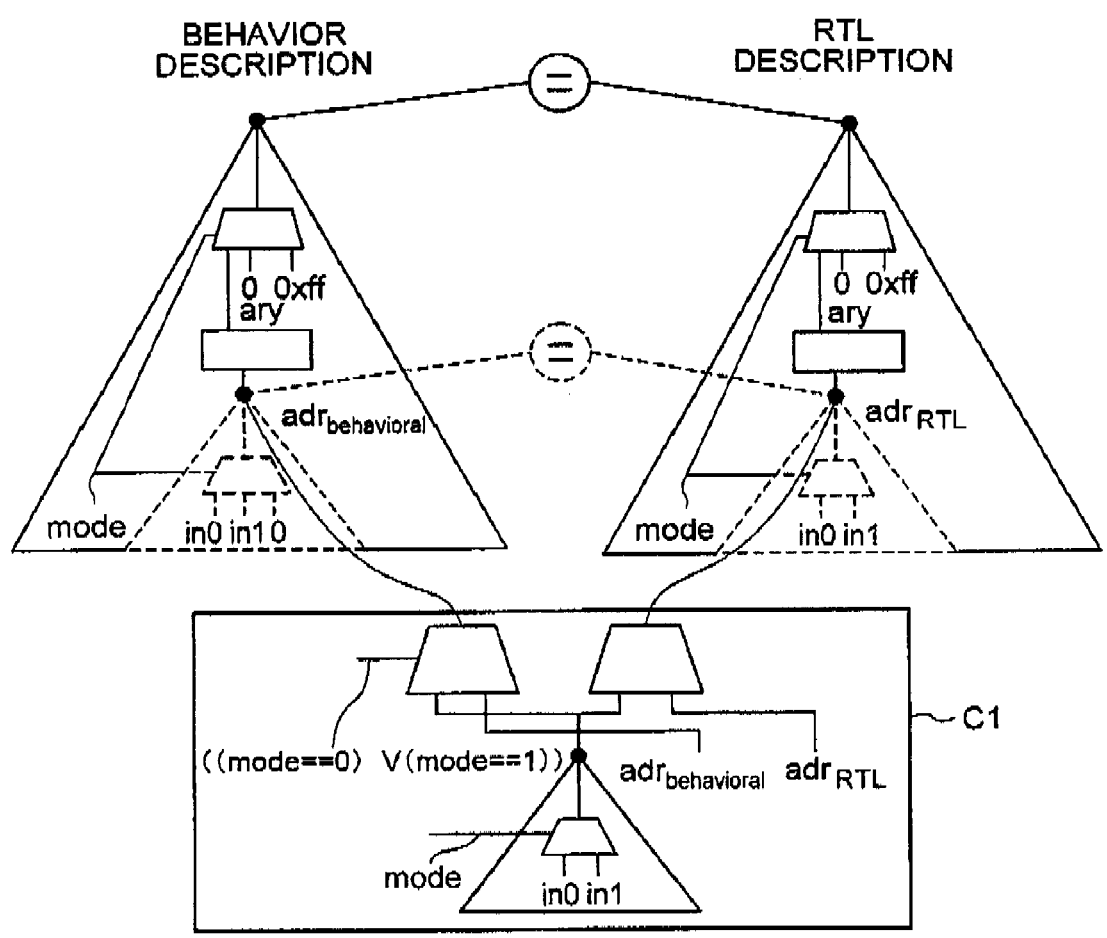
FIG. 7 shows, an example of intermediate cone simplification.
Figure 8:
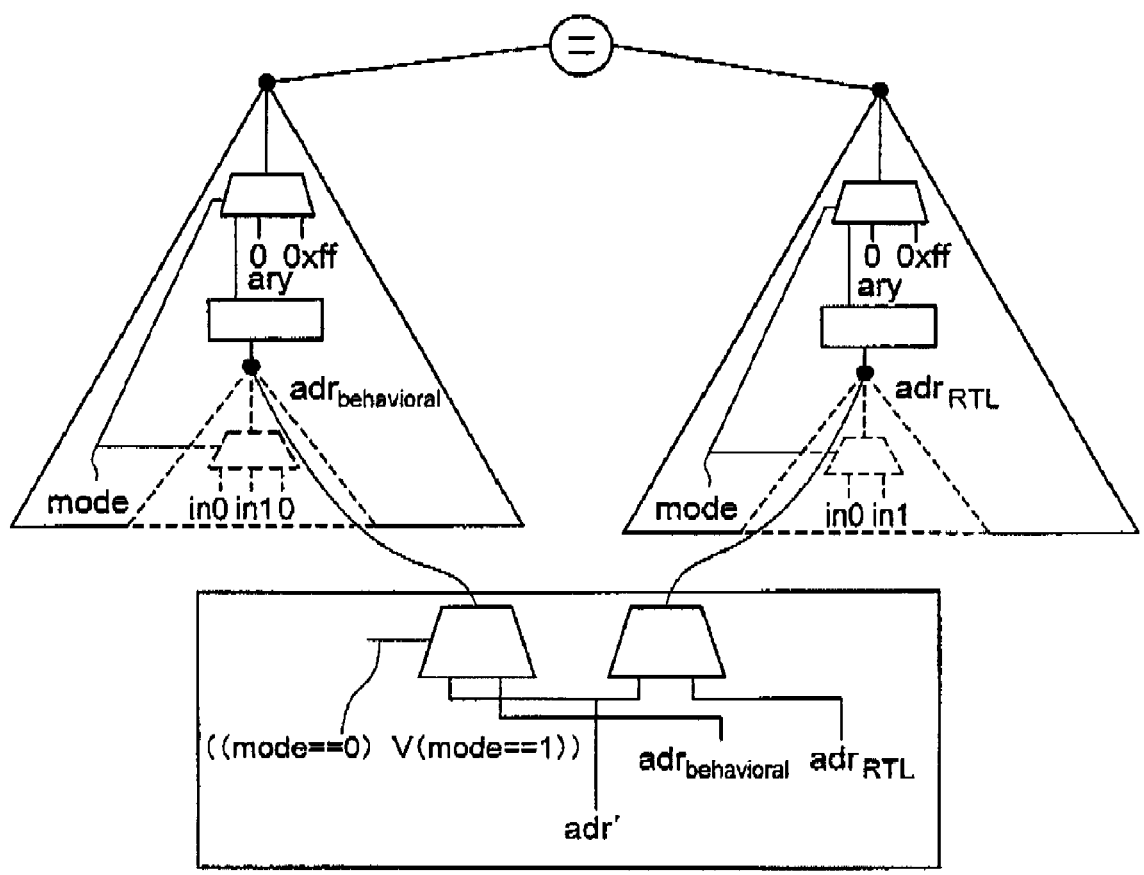
FIG. 8 shows another example of intermediate cone simplification.

After verifying the equivalence between the intermediate cones with respect to the intermediate signal line, control proceeds to Step A13 to simplify an intermediate cone portion determined to be equivalent at Step A13 with respect to the logic cone for a signal value of signal line "out0" to be verified. FIGS. 7 and 8 show examples of the intermediate cone simplification. These examples substitute common logic cone C1 for the intermediate cones with respect to intermediate signal line "adr" in the logic cone for the behavior description and the logic cone for the RTL description. The common logic cone C1 outputs "in0" or "in1" according to the "mode" value (FIG. 7) when the condition ((mode==0)v (mode==1)) is satisfied. The common logic cone C1 may be simply used as an intermediate terminal as shown in FIG. 8. When the condition is not satisfied, the common logic cone C1 outputs intermediate terminal "$adr_{behavioral}$" for the logic cone corresponding to the behavior description and outputs intermediate terminal "$adr_{RTL}$" for the logic cone corresponding to the RTL description.

Figure 9:
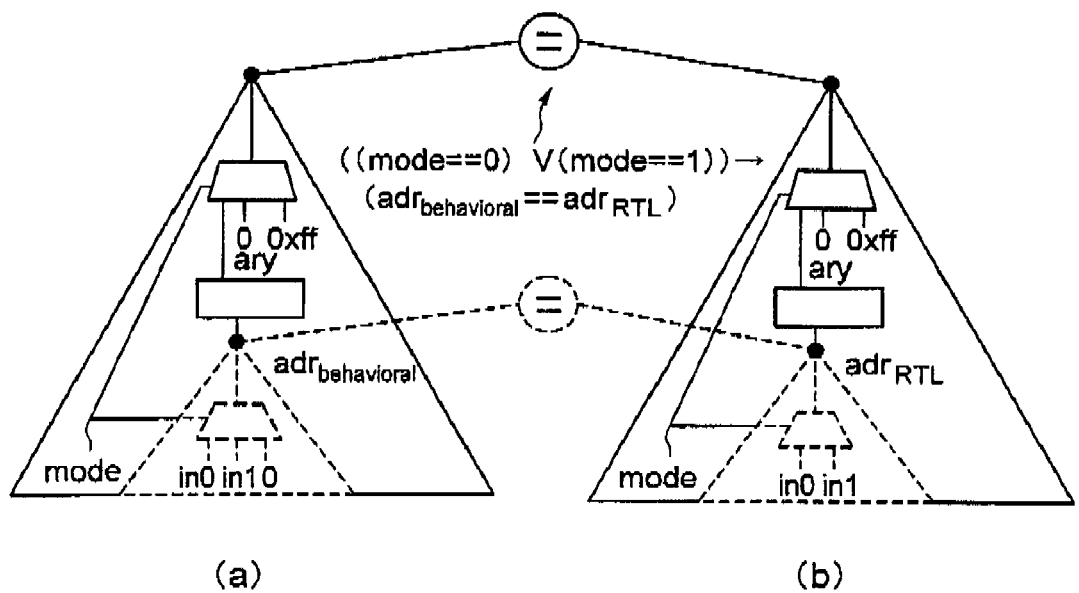
FIGS. 9(a) and (b) show another example of intermediate cone simplification.

When the intermediate signal lines are determined to be equivalent as described above, the intermediate cone simplification may instead assume the lines to be different intermediate terminals in the behavior description and the RTL description. Further, the logic cone may be provided with a precondition that the respective intermediate terminals become equivalent under the equivalence condition. FIG. 9 shows an example of this simplification. In this example, intermediate terminal "$adr_{behavior}$" substitutes the intermediate cone for signal line "adr" in a logic cone (shown in (a) of FIG. 9) corresponding to the behavior description. Intermediate terminal "$adr_{RTL}$" substitutes the intermediate cone for signal line "adr" in a logic cone (shown in (b) of FIG. 9) corresponding to the RTL description. Based on this, the simplification provides condition:

$$((mode==0)v(mode==1)) \rightarrow (adr_{behavioral}==adr_{RTL})$$

as a precondition for the logic cone. This condition indicates that the intermediate terminals for the two descriptions become equivalent under condition ((mode==0)v (mode==1)).

Finally at Step A14, the logic-cone comparison unit 115 compares logic cones for the signal line "out0" to be verified. The comparison checks the equivalence of the signal line "out0" to be verified using the logic cones as shown in FIGS. 7 or 9 that are stored in the intermediate-point-simplified-cone storage unit 114 and have the simplified intermediate cone for intermediate signal line "adr". The verification does not reference the intermediate cone for intermediate signal line "adr" in the behavior description and the RTL description. The simplified logic cone can be used to compare the signal line "out0" to be verified. Since individual logic cones to be compared can be reduced, it is possible to effectively confirm that "out0" is equivalent.

The behavior synthesis may optimize a circuit portion so as to be logically equivalent under a specific condition for referencing the circuit portion. The equivalence checking can provide the specific condition for referencing the circuit portion as a precondition. In this manner, it is possible to determine whether or not the behavior description and the RTL description for the circuit portion are equivalent under that condition. The behavior synthesis apparatus 102 performs the optimization by identifying a condition for referencing the circuit portion and therefore internally maintains the condition. The condition can be provided to the equivalence checking apparatus 10.

The equivalence checking apparatus 10 references the provided equivalence condition and checks the equivalence between the behavior description and the RTL description. When an attempt is made to simplify a logic cone with respect to signal values with respect to an intermediate point that can be determined to be equivalent, it is possible to find whether or not the optimization is provided so as to cause the equivalence only under the condition for referencing the intermediate point.

An intermediate point in the logic cone with respect to a given signal value is referenced under a specific condition. Based thereon, the optimization may be performed to provide the equivalence only under that condition. In such case, the equivalence checking apparatus 10 confirms that the intermediate point becomes equivalent when the condition is true. When the intermediate point is equivalent, the equivalence checking apparatus 10 simplifies the logic cone by replacing it with a common cone that represents the same value under the condition, for example. In this manner, the optimization can be performed so as to provide the logical equivalence only under the specific condition for referencing a circuit portion. The intermediate cone can be simplified even for an intermediate point that cannot be conventionally determined to be equivalent. Individual logic cones to de verified can be reduced. Accordingly, it is possible to verify the equivalence between the behavior description and the RTL description faster and through the use of a smaller storage area than conventional technologies.

According to the present embodiment the behavior synthesis apparatus 102 stores the condition used for the synthesis to reference the intermediate point as an equivalence condition in the equivalence-condition storage unit 111. Generally, the equivalence condition may be hardly known. As described above, the behavior synthesis apparatus 102 contains the equivalence condition as part of the synthesis information. The equivalence condition can be provided for the equivalence checking apparatus 10. When the behavior synthesis apparatus 102 closely cooperates with the equivalence checking apparatus 10 to use the synthesis information for equivalence checking, it is possible to improve the efficiency of the equivalence checking.

Figure 10:
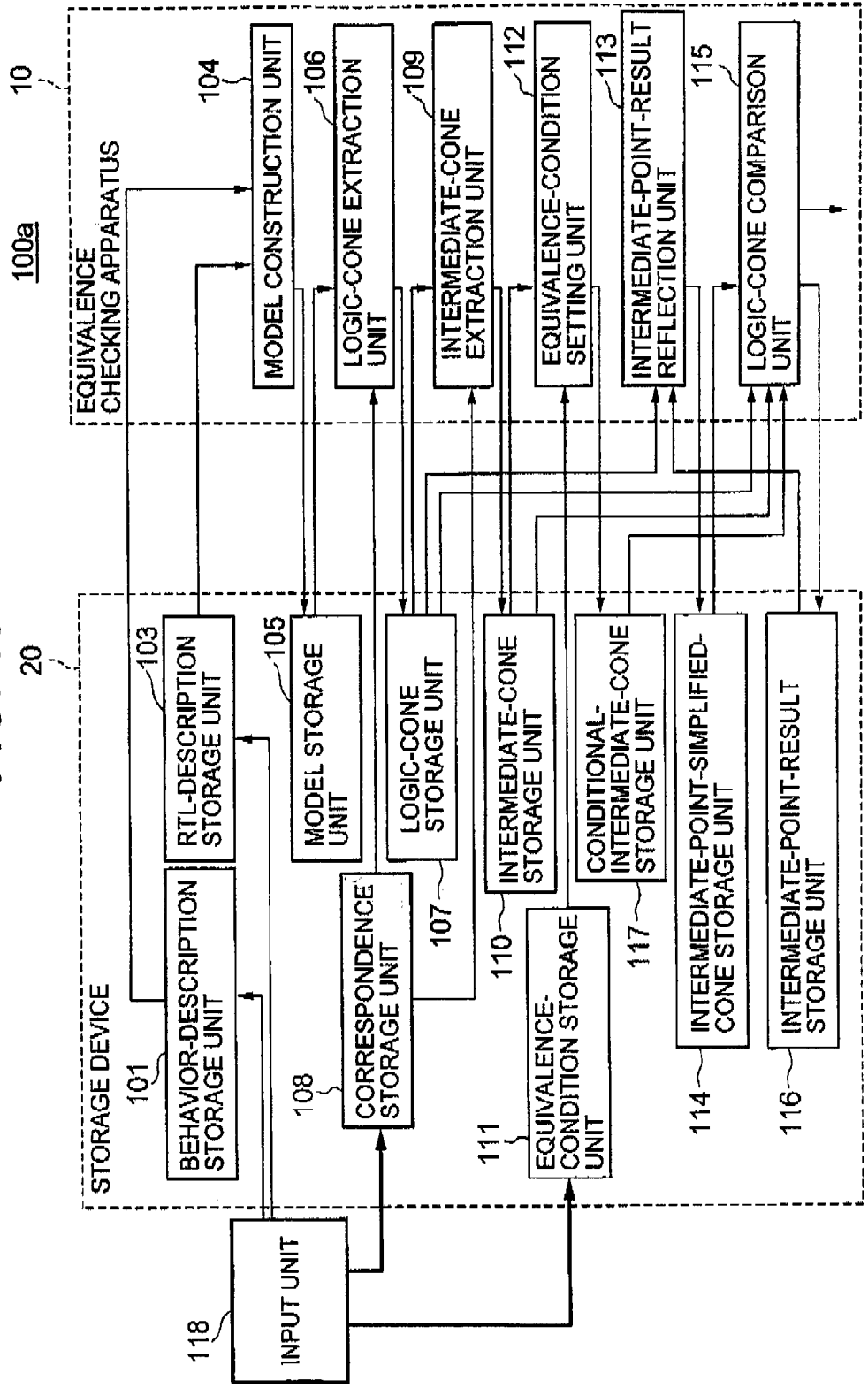
FIG. 10 is a block diagram showing the configuration of an equivalence checking system according to a second embodiment of the invention.

FIG. 10 shows the configuration of an equivalence checking system according to a second embodiment of the invention. An equivalence checking system 100*a* according to the embodiment differs from the first embodiment in that an input apparatus 118 is used instead of the behavior synthesis apparatus 102 (FIG. 2). According to the embodiment, a user (designer) uses the input apparatus 118 to store a behavior description in the behavior-description storage unit 101 and to store a RTL description designed based on the behavior description in the RTL-description storage unit 103. Using the input apparatus 118, the user stores a correspondence and an equivalence condition in the correspondence storage unit 108 and the equivalence-condition storage unit 111, respectively. The correspondence may be estimated from the information attached to a signal line name or a description in the behavior description and the RTL description when the model construction unit 104 constructs a model.

Figure 11:
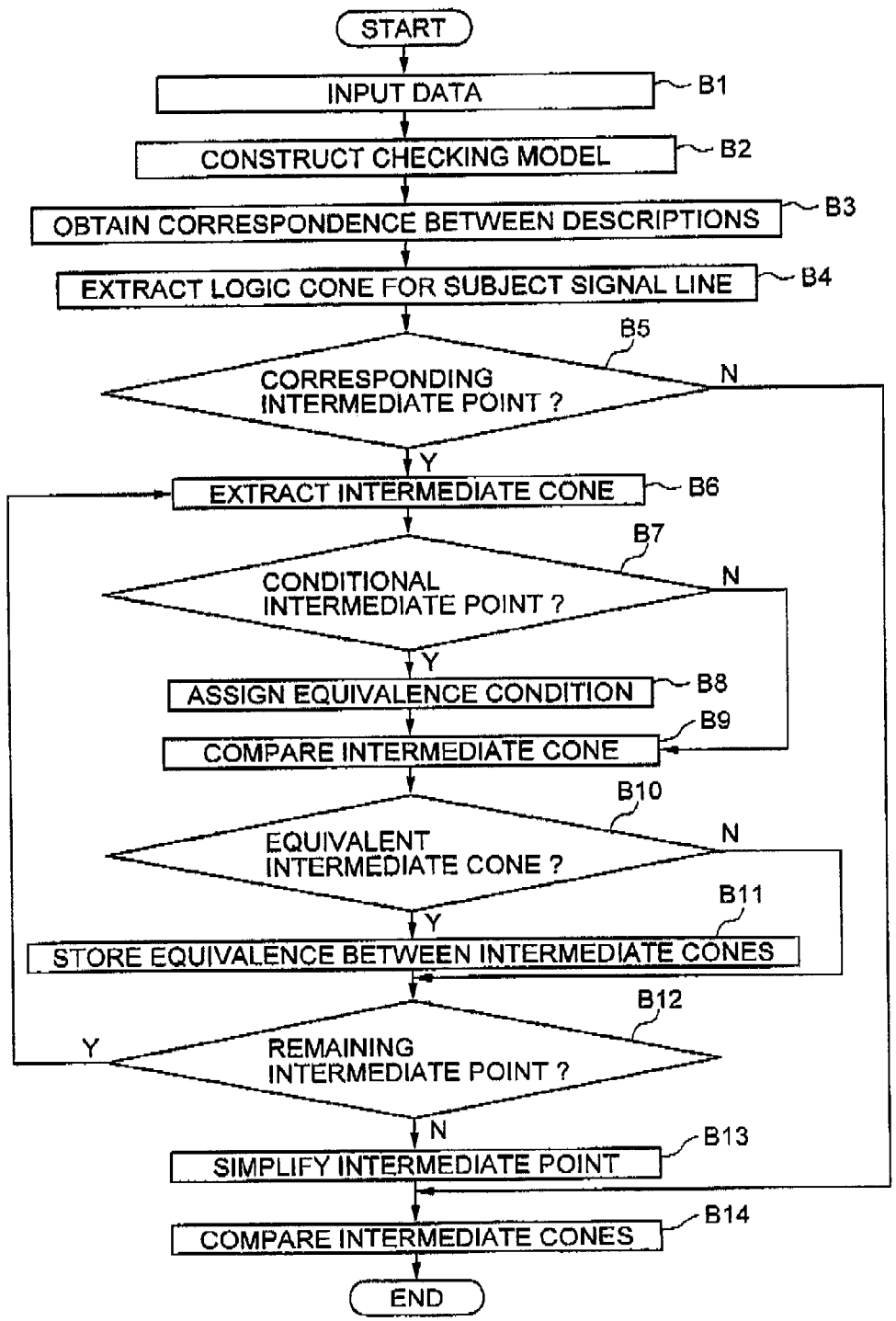
FIG. 11 is a flowchart showing an operational procedure of the equivalence checking system according to the second embodiment of the invention.

FIG. 11 shows an operational procedure of the equivalence checking system according to the present embodiment. Using the input apparatus 118, the designer inputs a behavior description, a RTL description created based on the behavior description, and a correspondence between the behavior description and the RTL description (Step B1). When the RTL description is optimized according to the condition to be referenced, the designer also inputs a condition that should be equivalent. The subsequent process follows steps similar to Steps A2 through A14 in FIG. 2. When an equivalence condition is settled for the corresponding intermediate point, the intermediate cone is simplified in consideration for the equivalence condition. A logic cone having the simplified intermediate cone is used to verify the equivalence between the behavior description and the RTL description (Steps B2 through B14).

The present embodiment is intended for a case where the behavior synthesis apparatus outputs no equivalence condition, the RTL description is directly manually optimized, or the RTL description is manually created from the behavior description. That is, there may be a case where the optimization is performed to provide the equivalence only under the condition for referencing a circuit portion within a range not affecting outputs and no equivalence condition can be acquired from the behavior synthesis apparatus. In such case, the embodiment can allow the input apparatus 118 to supply a necessary condition and simplify an intermediate cone for the optimized portion. Accordingly, it is possible to effectively verify the equivalence in such case.

Figure 12:
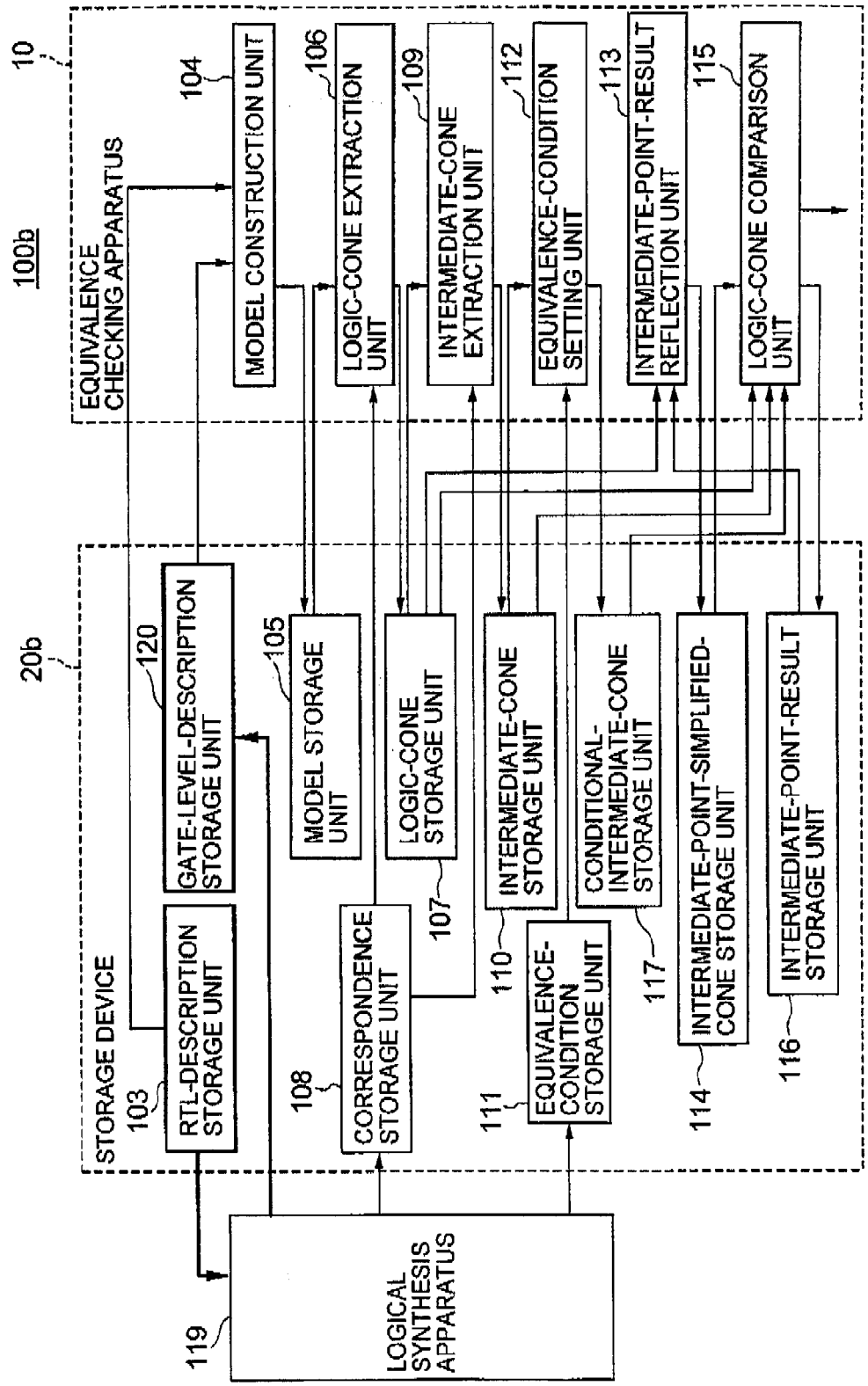
FIG. 12 is a block diagram showing the configuration of an equivalence checking system according to a third embodiment of the invention.

FIG. 12 shows the configuration of an equivalence checking system according to a third embodiment of the invention. An equivalence checking system 100*b* according to the embodiment differs from the first embodiment in that a logic synthesis apparatus 119 is used instead of the behavior synthesis apparatus 102 (FIG. 1). According to the present embodiment, the storage apparatus 20*b* includes a gate-level-description storage unit 120. The RTL-description storage unit 103 stores therein a RTL description created by a designer, for example. The logic synthesis apparatus 119 reads the RTL description from the RTL-description storage unit 103 and performs the logic synthesis on the read RTL description. The logic synthesis apparatus 119 stores a gate-level description resulting from the logic synthesis. The logic synthesis apparatus 119 also allows the equivalence condition storage unit 111 to store a condition for making an intermediate signal line equivalent.

The model construction unit 104 constructs a verification model for the RTL description and the gate-level description. The model construction unit 104 also determines a correspondence between the two descriptions according to information attached to a signal line name or a description in the two descriptions. After the model construction, the equivalence checking apparatus 10 operates similarly to the verification process described in the first embodiment except that the equivalence checking apparatus 10 checks the equivalence between the RTL description and the gate-level description.

The present embodiment is intended for a case where the equivalence is verified between the RTL description and the gate-level description before and after the logic synthesis and the optimization is performed during the logic synthesis to provide the equivalence only under the condition for referencing a circuit portion within a range not affecting outputs. In such case, the embodiment can simplify an intermediate cone by acquiring a condition with respect to the optimization from the logic synthesis apparatus. Accordingly, it is possible to efficiently verify the equivalence between the RTL description and the gate-level description.

Figure 13:
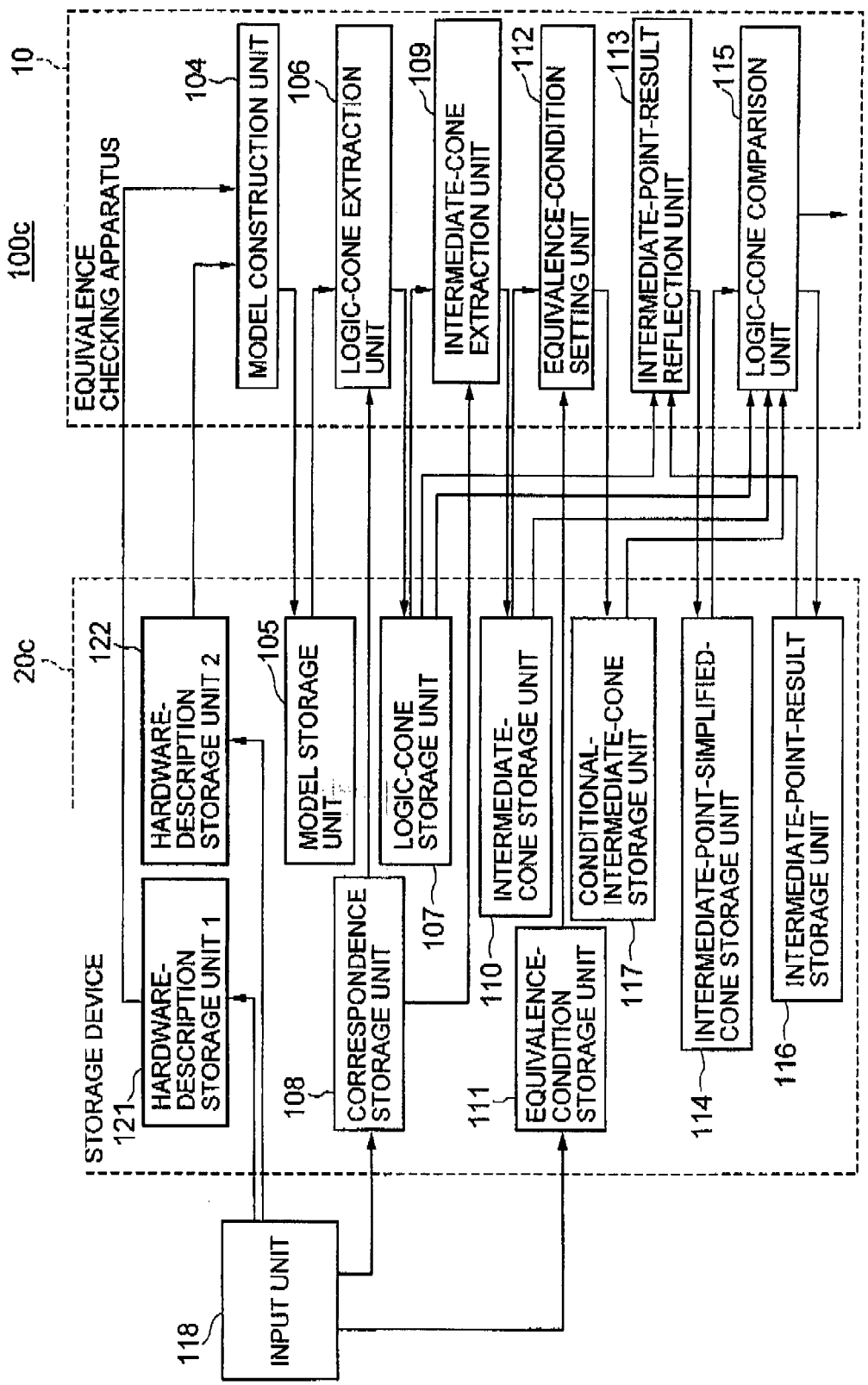
FIG. 13 is a block diagram showing the configuration of an equivalence checking system according to a fourth embodiment of the invention.

FIG. 13 shows the configuration of an equivalence checking system according to a fourth embodiment of the invention. An equivalence checking system 100c according to the present embodiment differs from the equivalence checking system 100a (FIG. 10) according to the second embodiment in that a storage apparatus 20c includes first and second hardware-description storage units 121 and 122 in the present embodiment. The first and second hardware-description storage units 121 and 122 store therein hardware descriptions such as an algorithm and a function to be implemented on the hardware. The hardware descriptions include a RTL description and a gate-level description, for example. Both the fast and second hardware-description storage units 121 and 122 store therein the RTL description or the gate-level description. Alternatively, the one stores the RTL description and the other stores the gate-level description. The input apparatus 118 is used to input the RTL description and the gate-level description.

According to the present embodiment, the equivalence checking apparatus 10 allows the model construction unit 104 to generate a verification model for each of the hardware descriptions stored in the first and second hardware-description storage units 121 and 122. The equivalence checking apparatus 10 uses the generated model to verify the equivalence between the two hardware descriptions. The present embodiment is intended for a case where the hardware description is optimized so as to provide the equivalence only under the condition for referencing a circuit portion within a range not affecting outputs. In such case, an intermediate cone can be simplified by directly manually supplying an optimization condition. Before and after the optimization, it is possible to efficiently determine whether or not the hardware descriptions are equivalent.

Figure 14:
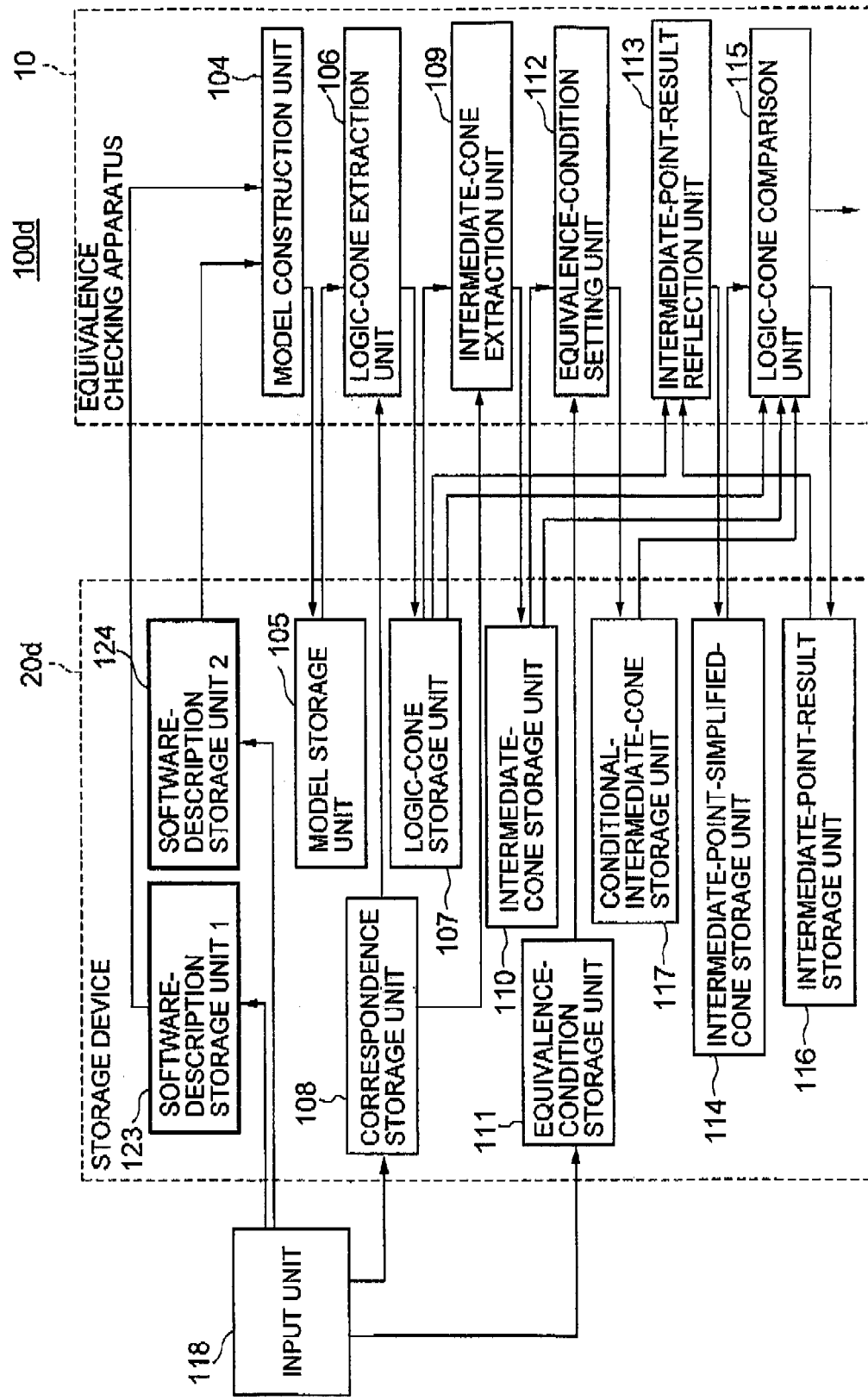
FIG. 14 is a block diagram showing the configuration of an equivalence checking system according to a fifth embodiment of the invention.
Figure 15:
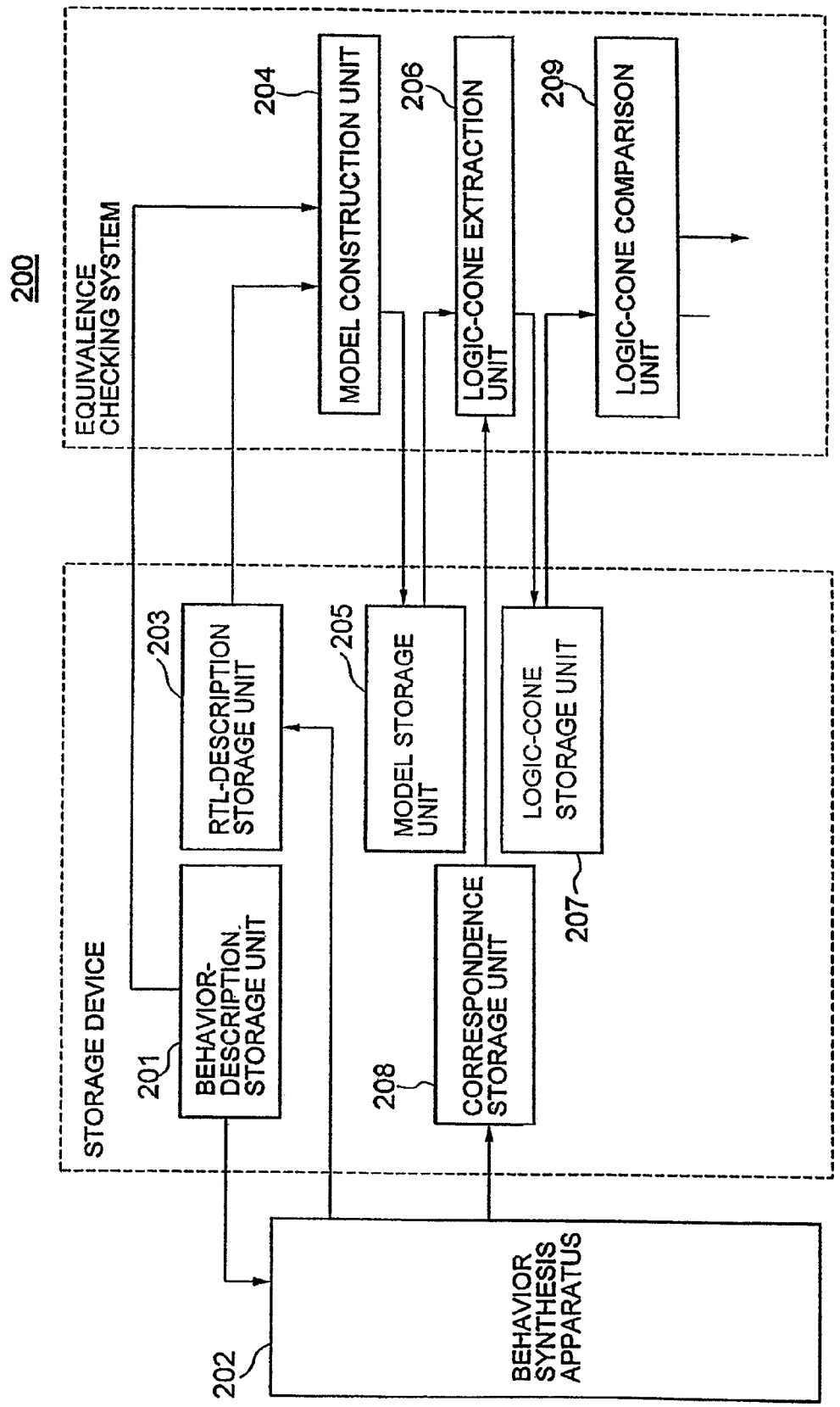
FIG. 15 is a block diagram showing the configuration of an equivalence checking system described in a literature.
Figure 16:
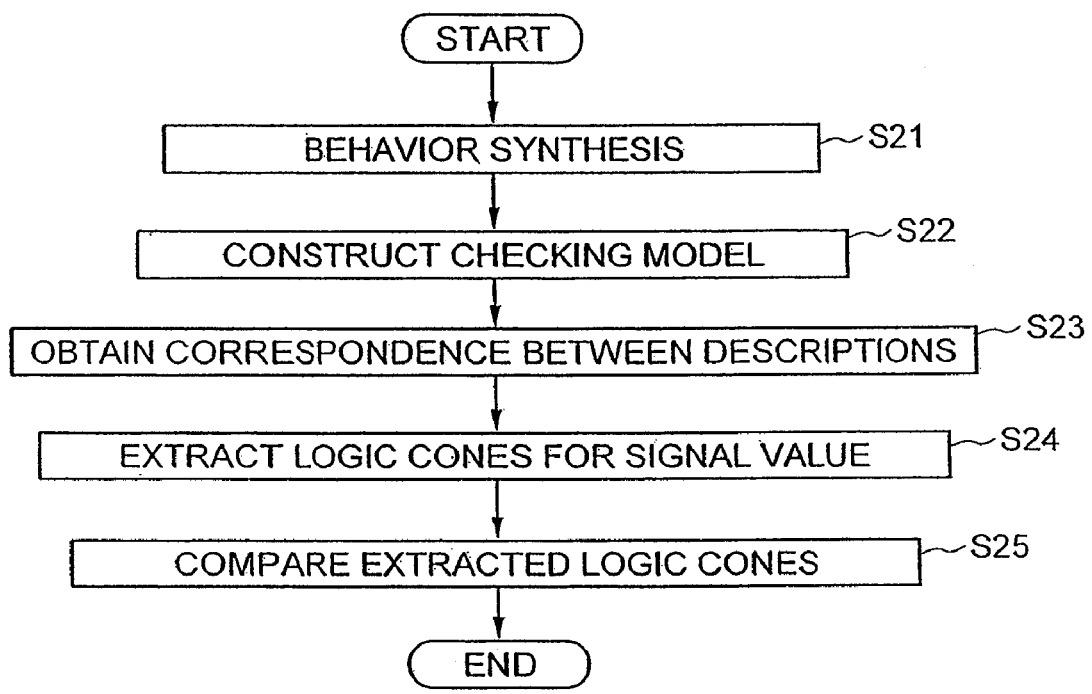
FIG. 16 is a flowchart showing an operational procedure of the equivalence checking system described in the literature.
Figure 17:
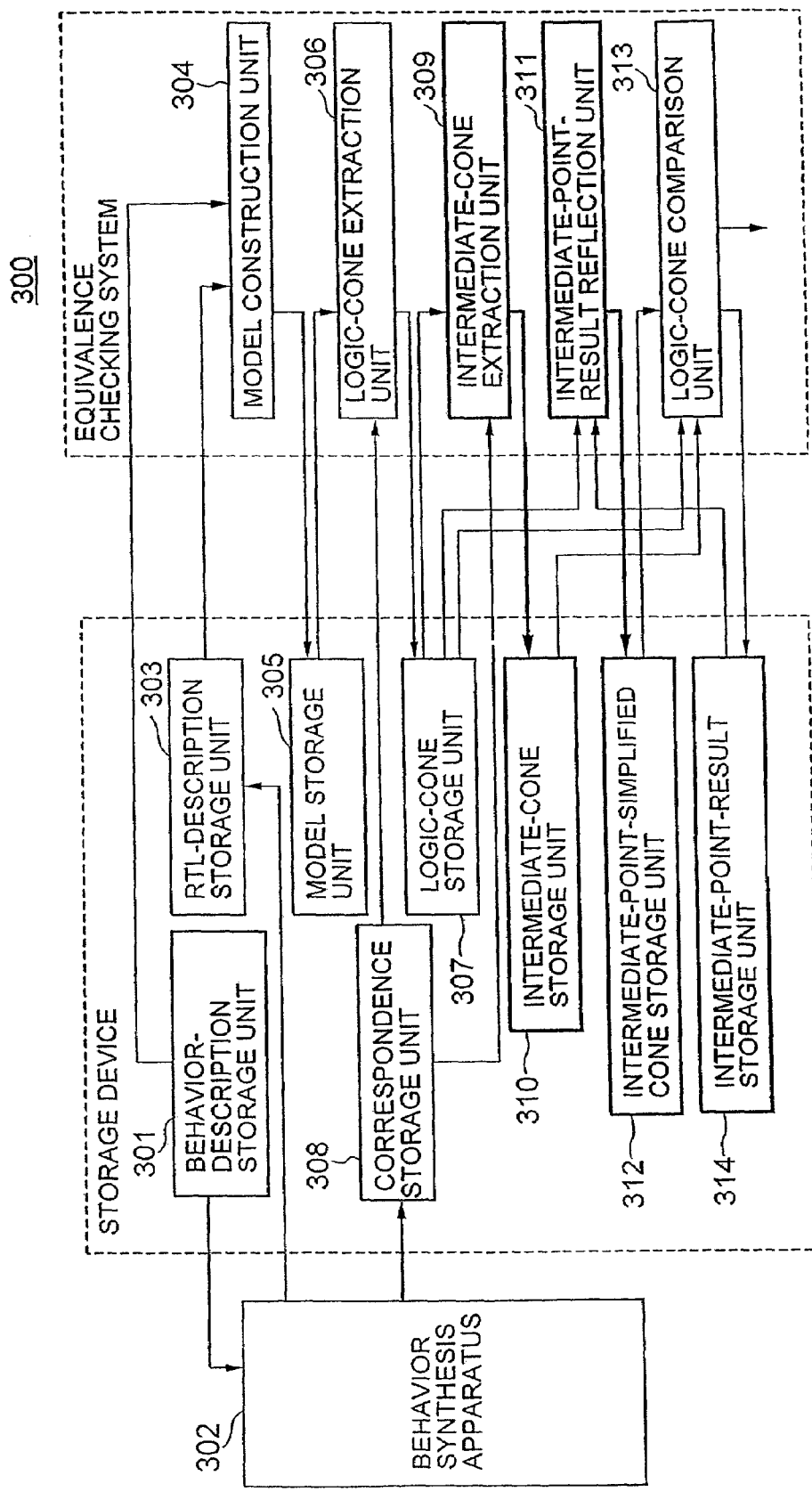
FIG. 17 is a block diagram showing the configuration of the equivalence checking system described in a patent publication.
Figure 18:
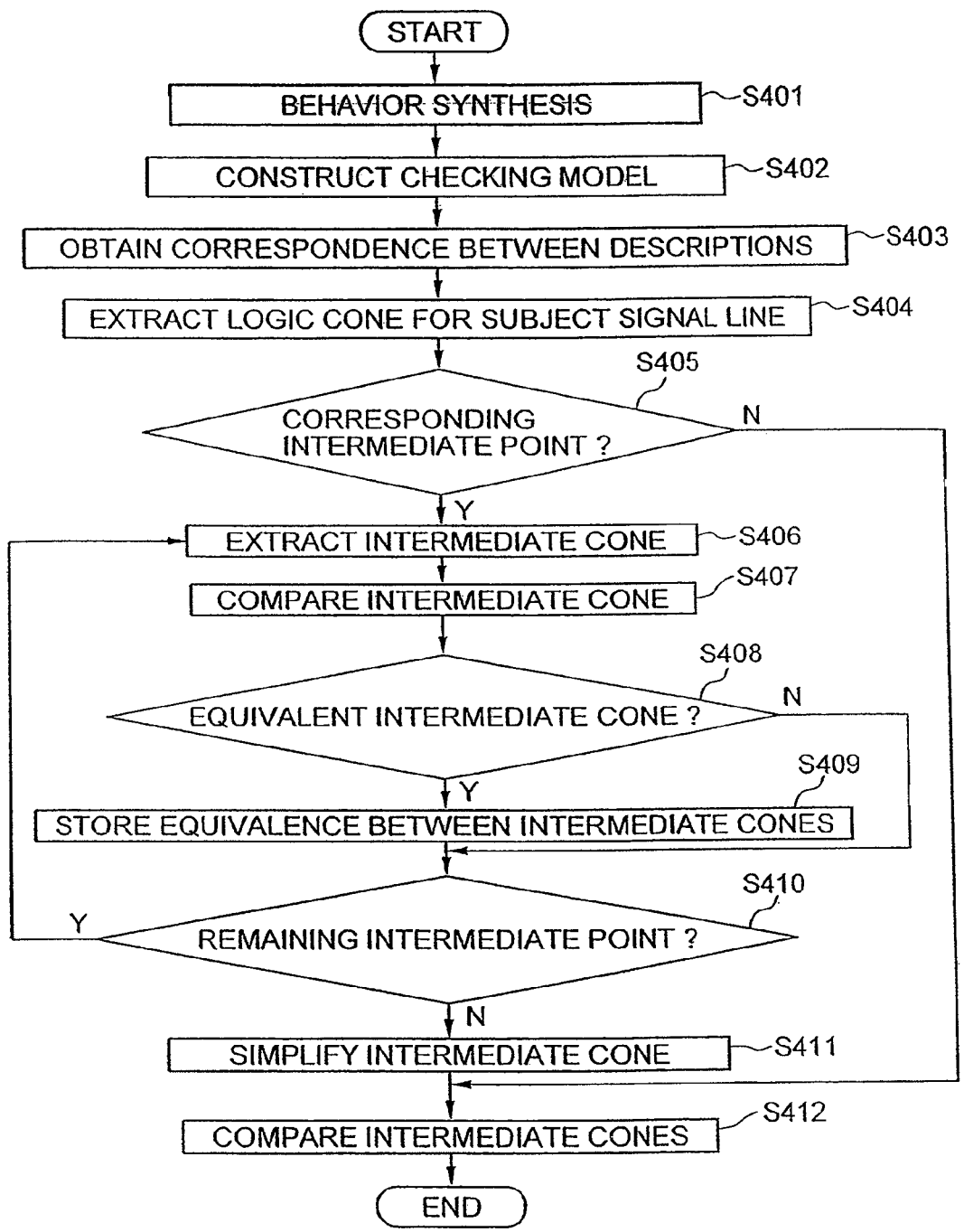
FIG. 18 is a flowchart showing an operational procedure of the equivalence checking system described in the patent publication.
Figure 19:
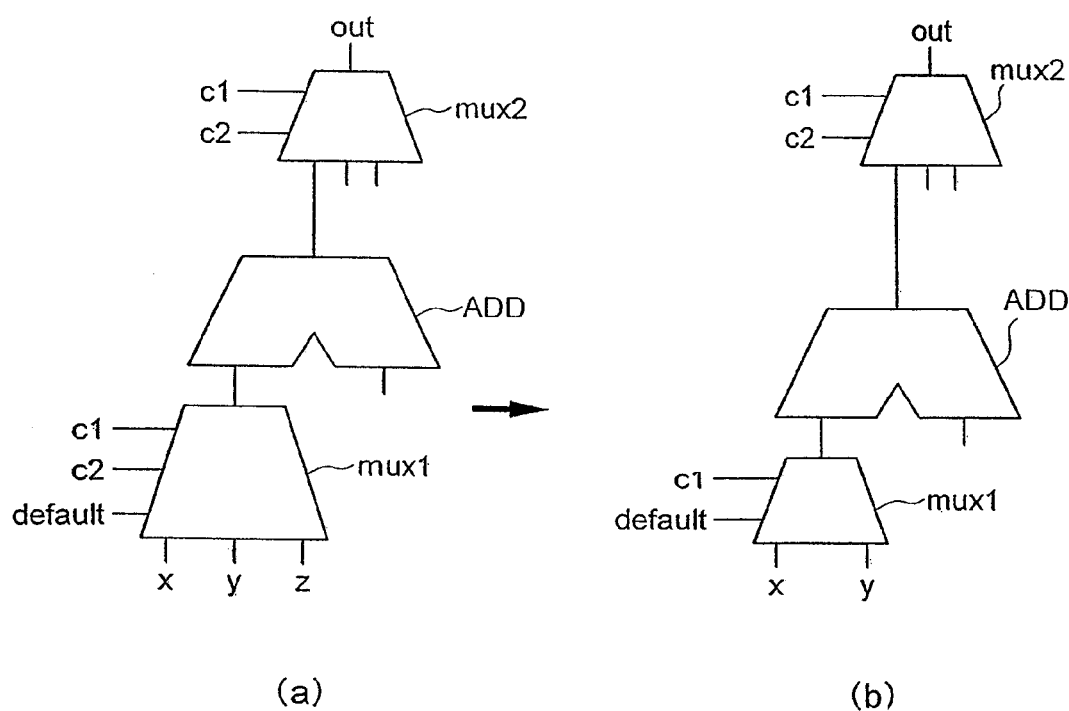
FIG. 19(a) shows an example of part of a circuit to be designed and FIG. 19(b) shows a circuit part equivalent to the circuit part shown in (a)
Figure 20:
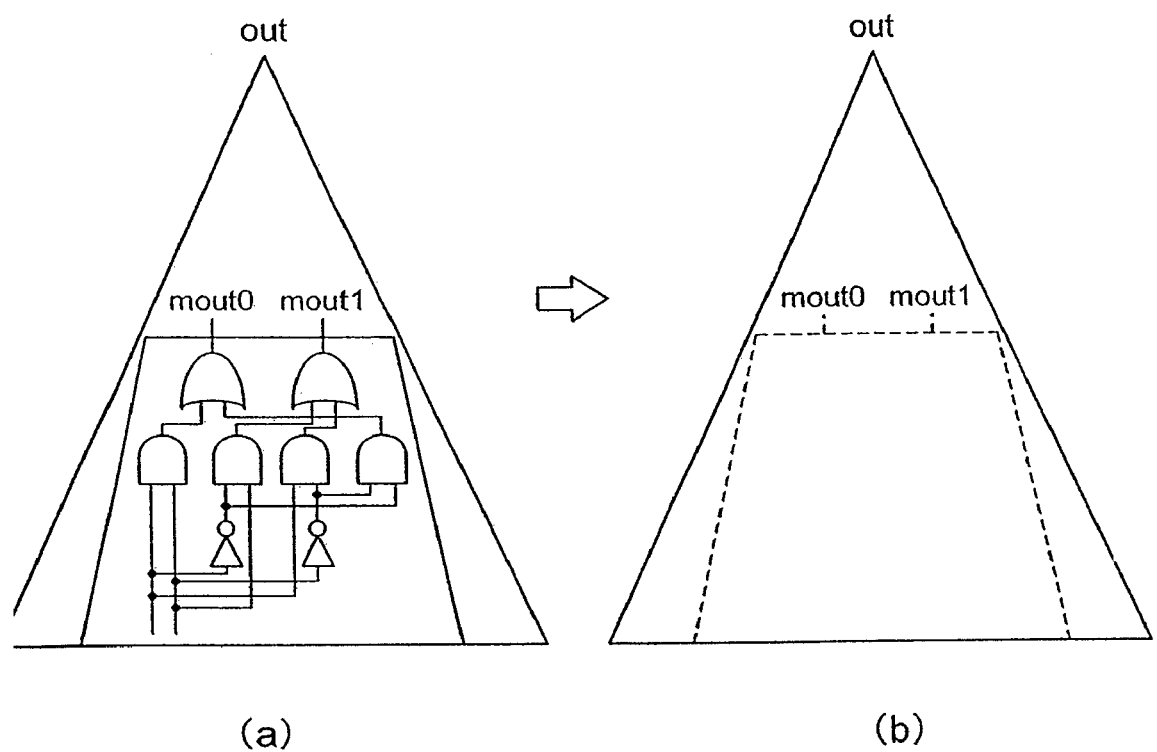
FIG. 20 shows logic cones used for behavior verification.

FIG. 14 shows the configuration of an equivalence checking system according to a fifth embodiment of the invention. An equivalence checking system 100d according to the present embodiment differs from the fourth embodiment in that a storage apparatus 20d includes first and second software description storage units 123 and 124 in the present embodiment. The first and second software description storage units 123 and 124 store therein software descriptions. The software descriptions include an algorithm and an operation to be performed on the hardware. The software descriptions may include a driver, an operating system and various applications coded in a given programming language. The input apparatus 118 is used to input the software description. The equivalence checking apparatus 10 allows the model construction unit 104 to generate a verification model for each of the software descriptions stored in the first and second software description storage units 123 and 124. The equivalence checking apparatus 10 uses the generated model to verify the equivalence between the two software descriptions.

When two software descriptions are input, the model construction unit 104 constructs a verification model using a model that can represent a variation in the control structure or the variable. The equivalence checking apparatus 10 can extract a logic cone with respect to a function for variable values from the model and verify the equivalence between the two software descriptions. The software description is also optimized so as to provide the equivalence under the condition for referencing a partial description within a range not affecting outputs. Since it is possible to expect behavior acceleration and object code compaction, the optimization is not limited to the hardware description. When an intermediate point is optimized so as to provide the equivalence only under the referenced condition, the embodiment can efficiently verify the equivalence between two software descriptions by assuming such intermediate point to be equivalent within a range not affecting result outputs.

While there have been described the preferred embodiments of the invention, the equivalence checking system, behavior synthesis apparatus, method, and program of the invention are not limited thereto. The scope of the invention also includes various changes and modifications made in the above-described embodiments.

The present invention can be applied to an equivalence checking apparatus that formally checks equivalence between two hardware or software descriptions including a behavior description and a RTL description.

What is claimed is:

1. An equivalence checking apparatus for checking equivalence between a first description and a second description, comprising:

an intermediate cone extracting unit for extracting, from the first and second descriptions, an intermediate cone pair corresponding to each other and defined from an objective signal line common to the first and second descriptions:

a logic-cone comparison unit for comparing the extracted intermediate cone pair while referencing an equivalence condition defining a condition for referencing stored corresponding to the intermediate cone pair in an equivalence-condition storage unit, said logic-cone comparison unit judging whether or not the intermediate cone pair is equivalent to each other under the equivalence condition; and an intermediate-point-result reflection unit for simplifying the logic cone pair with respect to the intermediate cone pair if said logic-cone comparison unit judges an equivalence wherein said intermediate-point-result reflection unit simplifies the logic cone pair by replacing the intermediate cone pair with a common cone pair in the first and second descriptions, the common cone pair outputting a common signal value if the equivalence condition is satisfied and different signal values if the equivalence condition is not satisfied.

2. The equivalence checking apparatus according to claim 1, wherein said intermediate-point-result reflection unit simplifies the logic cone pair by replacing the intermediate cone pair with different intermediate terminals in the first and second descriptions, and setting an equivalence between the different cones under the equivalence condition being satisfied in the logic cone pairs in the first and second descriptions.

3. The equivalence checking apparatus according to claim 1, wherein the first and second descriptions each are a software description or a hardware description.

4. The equivalence checking apparatus according to claim 1, further comprising an input unit for inputting the equivalence condition in said equivalence-condition storage unit.

5. The equivalence checking apparatus according to claim 1, wherein the first and second descriptions are behavior and RTL (register transfer level) descriptions, respectively.

6. The equivalence checking apparatus according to claim 5, further comprising a behavior synthesis apparatus for synthesizing the behavior description to generate the RTL description.

7. The equivalence checking apparatus according to claim 6, wherein said behavior synthesis apparatus stores an equivalence condition in an equivalence-condition storage unit.

8. The equivalence checking apparatus according to claim 1, wherein the first and second descriptions are RTL (register transfer level) and gate-level descriptions, respectively.

9. The equivalence checking apparatus according to claim 8, further comprising a logic synthesis apparatus for logic synthesis of the RTL description to generate the gate-level description.

10. The equivalence checking apparatus according to claim 9, wherein said logic synthesis apparatus stores the equivalence condition in said equivalence-condition storage unit.

11. A method for checking equivalence between a first description and a second description in a computer, comprising the steps of:
    an extracting unit configured to extract from the first and second descriptions, an intermediate cone pair corresponding to each other and defined from an objective signal line common to the first and second descriptions:
    a comparison unit configured to compare the extracted intermediate cone pair while referencing an equivalence condition defining a condition for referencing stored corresponding to the intermediate cone pair in an equivalence-condition storage unit, to judge whether or not the intermediate cone pair is equivalent to each other under the equivalence condition;
    a simplifying unit configured to simplfy the logic cone pair with respect to the intermediate cone pair if said logic-cone comparing step judges an equivalence; and
    a judging unit configured to judge an equivalence between the first description and the second description based on the simplified logic cone wherein said simplifying step simplifies the logic cone pair by replacing the intermediate cone pair with a common cone pair in the first and second descriptions, the common cone pair outputting a common signal value if the equivalence condition is satisfied, and different signal values if the equivalence condition is not satisfied.

12. The method according to claim 11, wherein said simplifying step simplifies the logic cone pair by replacing the intermediate cone pair with different intermediate terminals in the first and second descriptions, and setting an equivalence between the different cones under the equivalence condition being satisfied in the logic cone pairs in the first and second descriptions.

13. The method according to claim 11, wherein the first and second descriptions each are a software description or a hardware description.

14. The method according to claim 11, further comprising the step of inputting the equivalence condition in said equivalence-condition storage unit.

15. The method according to claim 11, wherein the first and second descriptions are behavior and RTL (register transfer level) descriptions, respectively.

16. The method according to claim 15, further comprising the step of synthesizing the behavior description to generate the RTL description.

17. The method according to claim 16, wherein said synthesizing step stores an equivalence condition in an equivalence-condition storage unit.

18. The method according to claim 11, wherein the first and second descriptions are RTL and gate-level descriptions, respectively.

19. The method according to claim 18, further comprising the step of logically synthesizing the RTL (register transfer level) description to generate the gate-level description.

20. The method according to claim 19, wherein said logically synthesizing step stores the equivalence condition in said equivalence-condition storage unit.

21. A computer program stored on a computer readable storage medium for checking equivalence between a first description and a second description, to execute said computer program in the steps of:
    extracting, from the first and second descriptions, an intermediate cone pair corresponding to each other and defined from an objective signal line common to the first and second descriptions:
    comparing the extracted intermediate cone pair while referencing an equivalence condition defining a condition for referencing stored corresponding to the intermediate cone pair in an equivalence-condition storage unit, to judge whether or not the intermediate cone pair is equivalent to each other under the equivalence condition;
    simplifying the logic cone pair with respect to the intermediate cone pair if said logic-cone comparing step judges an equivalence; and
    judging an equivalence between the first description and the second description based on the simplified logic cone wherein said simplifying step simplifies the logic cone pair by replacing the intermediate cone pair with a common cone pair in the first and second descriptions, the common cone pair outputting a common signal value if the equivalence condition is satisfied, and different signal values if the equivalence condition is not satisfied.

22. The program according to claim 21, wherein said intermediate-point-result reflection unit simplifies the logic cone pair by replacing the intermediate cone pair with different intermediate terminals in the first and second descriptions, and setting an equivalence between the different cones under the equivalence condition being satisfied in the logic cone pairs in the first and second descriptions.

23. The program according to claim 21, wherein the first and second descriptions each are a software description or a hardware description.

24. The program according to claim 21, further operating said computer in the step of inputting the equivalence condition in said equivalence-condition storage unit.

25. The program according to claim 21, wherein the first and second descriptions are behavior and RTL (register transfer level) descriptions, respectively.

26. The program according to claim 25, further operating said computer in the step of synthesizing the behavior description to generate the RTL description.

27. The program according to claim 26, wherein said synthesizing step stores an equivalence condition in an equivalence-condition storage unit.

28. The program according to claim 21, wherein the first and second descriptions are RTL (register transfer level) and gate-level descriptions, respectively.

29. The program according to claim 28, further operating aid computer in the step of logically synthesizing the RTI description to generate the gate-level description.

30. The program according to claim 29, wherein said logically synthesizing step stores the equivalence condition in said equivalence-condition storage unit.

* * * * *